United States Patent
Shibata

(10) Patent No.: US 8,868,233 B2
(45) Date of Patent: Oct. 21, 2014

(54) CONTROL APPARATUS, A SUBSTRATE TREATING METHOD, A SUBSTRATE TREATING SYSTEM, A METHOD OF OPERATING A SUBSTRATE TREATING SYSTEM, A LOAD PORT CONTROL APPARATUS, AND A SUBSTRATE TREATING SYSTEM HAVING THE LOAD PORT CONTROL APPARATUS

(75) Inventor: Hideki Shibata, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 3 days.

(21) Appl. No.: 13/541,345

(22) Filed: Jul. 3, 2012

(65) Prior Publication Data

US 2013/0013103 A1 Jan. 10, 2013

(30) Foreign Application Priority Data

Jul. 5, 2011 (JP) .................. 2011-148772

(51) Int. Cl.
*G06F 7/00* (2006.01)
*H01L 21/67* (2006.01)
*H01L 21/677* (2006.01)
*G05B 19/418* (2006.01)

(52) U.S. Cl.
CPC .... *H01L 21/67276* (2013.01); *H01L 21/67736* (2013.01); *G05B 2219/45032* (2013.01); *G05B 19/41865* (2013.01)
USPC ........... 700/228; 700/229; 700/213; 700/222; 700/220

(58) Field of Classification Search
None
See application file for complete search history.

(56) References Cited

U.S. PATENT DOCUMENTS

| | | | |
|---|---|---|---|
| 5,464,313 A | 11/1995 | Ohsawa | |
| 7,578,650 B2 | 8/2009 | Aalund et al. | |
| 2004/0046545 A1 | 3/2004 | Akiyama et al. | |
| 2006/0152211 A1* | 7/2006 | Iijima et al. | 324/158.1 |
| 2007/0081881 A1 | 4/2007 | Okuno et al. | 414/217 |
| 2008/0199284 A1 | 8/2008 | Mitsuyoshi et al. | 414/223.02 |
| 2010/0063620 A1* | 3/2010 | Kuo et al. | 700/214 |
| 2010/0215461 A1 | 8/2010 | Kamikawa et al. | |

FOREIGN PATENT DOCUMENTS

| | | | |
|---|---|---|---|
| JP | H06-236854 | 8/1994 | |
| JP | 2002-217262 A | 8/2002 | |
| JP | 2006-013040 | 1/2006 | |
| JP | 2006013040 A * | 1/2006 | ............ H01L 21/677 |
| JP | 2008-508731 | 3/2008 | |
| JP | 2008-198882 | 8/2008 | |
| JP | 2010-192855 | 9/2010 | |
| WO | WO 2005/036617 | 4/2005 | |

OTHER PUBLICATIONS

Search Report dated Aug. 4 2014 for the corresponding Chinese Patent Application No. 201210231966.7 (8 pages).

* cited by examiner

*Primary Examiner* — Yolanda Cumbess
(74) *Attorney, Agent, or Firm* — Ostrolenk Faber LLP

(57) ABSTRACT

A control apparatus in a substrate treating system with a substrate treating apparatus having a physical load port for receiving pods for storing substrates, and a carrier transport system for transporting the pods to and from the physical load port. The control apparatus includes a virtual load port control device for allotting a virtual load port to the physical load port, and instructing the carrier transport system to perform a transporting operation to and from the virtual load port on an assumption that the virtual load port really exists.

17 Claims, 17 Drawing Sheets

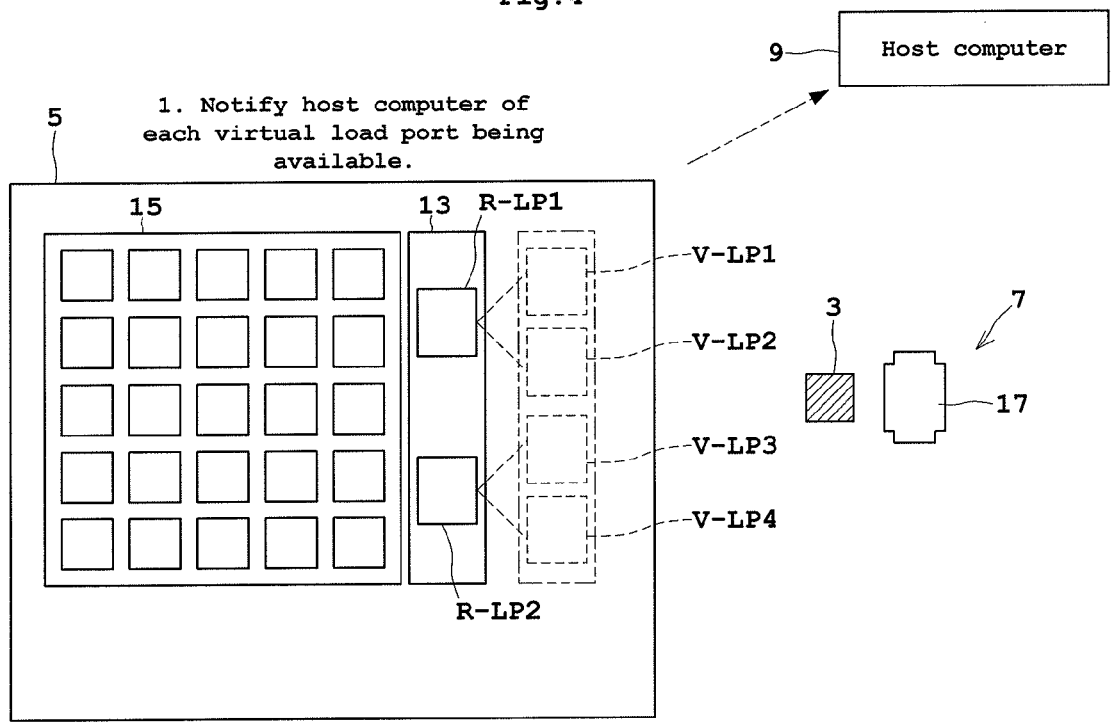
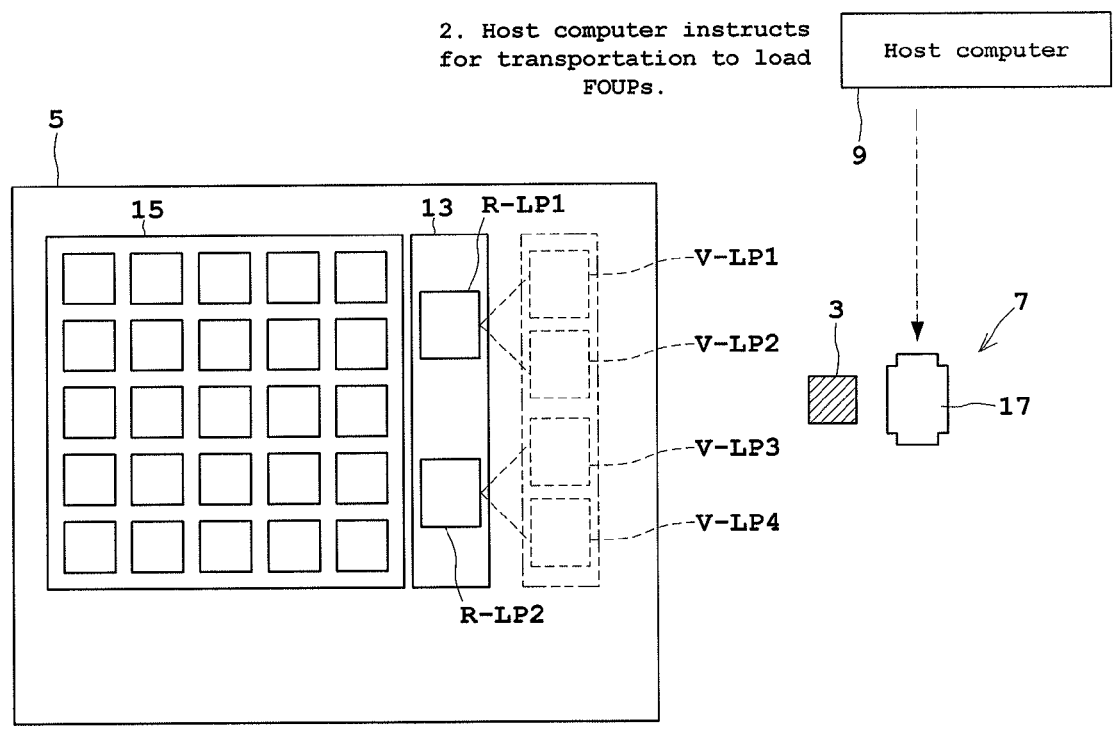

3. Host computer instructs carrier transport system to carry out transport for fetching (unloading).

4. OHTs 17a & 17b of carrier transport system move to substrate treating apparatus for unloading.

CONTROL APPARATUS, A SUBSTRATE TREATING METHOD, A SUBSTRATE TREATING SYSTEM, A METHOD OF OPERATING A SUBSTRATE TREATING SYSTEM, A LOAD PORT CONTROL APPARATUS, AND A SUBSTRATE TREATING SYSTEM HAVING THE LOAD PORT CONTROL APPARATUS

BACKGROUND OF THE INVENTION (1) Field of the Invention

This invention relates to a control apparatus for controlling transfer of semiconductor wafers, substrates for liquid crystal displays, substrates for plasma displays, substrates for organic EL devices, substrates for FEDs (Field Emission Displays), substrates for optical displays, substrates for magnetic disks, substrates for magnetic optical disks, substrates for photomasks, or substrates for solar cells (hereinafter called simply substrates), along with pods, to and from an interior of a substrate treating apparatus, and for controlling transfer of the pods to and from a carrier transport system. The invention relates also to a substrate treating method, a substrate treating system, a method of operating a substrate treating system, a load port control apparatus, and a substrate treating system having the load port control apparatus.

(2) Description of the Related Art

Conventionally, a substrate treating system of this type includes a substrate treating apparatus, and a carrier transport system for transporting pods upon instructions of a host computer which performs overall control of the treating system. The substrate treating apparatus has a substrate treating unit, a pod storage and transport unit, a load port, and a load port control device.

The substrate treating unit carries out various types of treatment for substrates. The pod storage and transport unit is juxtaposed to the substrate treating unit for storing and transporting FOUPs (Front Opening Unified Pods) containing the substrates. The load port is juxtaposed to the pod storage and transport unit for receiving the FOUPs. The load port control device controls transfer of the FOUPs to and from the pod storage and transport unit and to and from the carrier transport system. The carrier transport system is an automated material handling system having automatic guided vehicles (AGV), or an overhead hoist transfer, which transfers the FOUPS to and from the load port. The host computer carries out controls relating to transportation of the pods through communication with the load port control device and the carrier transport system.

Generally, one substrate treating apparatus has a plurality of load ports. With an improvement in treatment efficiency of the substrate treating unit, the number of pods to be transported will increase. The efficiency of the substrate treating unit cannot be used to full advantage without reducing transport intervals of the pods by the carrier transport system. However, with this type of carrier transport system, a plurality of transport vehicles in the carrier transport system do not load the pods into one load port at the same time. In general use (standard), only one transport vehicle loads the pods into one load port. And under restrictions imposed by the layout of the carrier transport system, for example, the time taken for one transport vehicle to load the pods into one load port cannot be shortened to be less than a certain level. Consequently, transportation by the carrier transport system cannot keep up an expected pace, resulting in a problem of reduced treatment efficiency.

In the circumstances, a first apparatus has been proposed, which has the number of load ports increased in a height direction, with a corresponding increase in the running lane of the carrier transport system to two (see Patent Document 1, for example). Further, a second apparatus has been proposed, which provides a movable buffer adjacent a load port to serve as a temporary turnout for pods, so that the load port may be made vacant in a short time (see Japanese Unexamined Patent Publication No. 2010-192855, for example).

However, the conventional examples with such constructions have the following drawbacks.

The first conventional apparatus requires increases in the number of load ports and the number of running lanes of the carrier transport system. This poses a problem of increased apparatus cost.

The second conventional apparatus requires the special movable buffer provided adjacent the load port, which again poses a problem of increased apparatus cost.

SUMMARY OF THE INVENTION

This invention has been made having regard to the state of the art noted above, and its object is to provide a control apparatus, a substrate treating method, a substrate treating system, a method of operating a substrate treating system, a load port control apparatus, and a substrate treating system having the load port control apparatus, which are capable of improving the efficiency of transporting pods while holding down apparatus cost, without increasing or complicating mechanical components such as load ports.

The above object is fulfilled, according to this invention, by a control apparatus in a substrate treating system with a substrate treating apparatus having a physical load port for receiving pods for storing substrates, and a carrier transport system for transporting the pods to and from the physical load port, the control apparatus comprising a virtual load port control device for allotting a virtual load port to the physical load port, and instructing the carrier transport system to perform a transporting operation to and from the virtual load port on an assumption that the virtual load port really exists.

In another aspect of this invention, there is provided a substrate treating method for a substrate treating system with a substrate treating apparatus having a physical load port for receiving pods for storing substrates, and a carrier transport system for transporting the pods to and from the physical load port, the substrate treating method comprising allotting a virtual load port to the physical load port, and instructing the carrier transport system to perform a transporting operation to and from the virtual load port on an assumption that the virtual load port really exists.

In a further aspect of this invention, there is provided a substrate treating system with a substrate treating apparatus having a physical load port for receiving pods for storing substrates, and a carrier transport system for transporting the pods to and from the physical load port, the substrate treating system comprising a virtual load port control device for allotting a virtual load port to the physical load port, and instructing the carrier transport system to perform a transporting operation to and from the virtual load port on an assumption that the virtual load port really exists.

According to the invention described above, the virtual load port control device allots a virtual load port to the physical load port, and instructs the carrier transport system to perform a transporting operation to and from the virtual load port on an assumption that the virtual load port really exists. Therefore, the carrier transport system can be made to perform a transporting operation as if there were more physical load ports than the actual number thereof. As a result, the control apparatus, substrate treating method, and substrate treating system which are capable of improving the efficiency of transporting the pods are realized while holding down apparatus cost, without increasing the mechanical components of the substrate treating apparatus.

This invention further provides a method of operating a substrate treating system with a substrate treating apparatus having a physical load port for receiving pods for storing substrates and a physical load port control device for controlling operation of the physical load port, and a carrier transport system for transporting the pods to and from the physical load port, the method of operating the substrate treating system comprising interposing a virtual load port control device between the physical load port control device and the carrier transport system for allotting a virtual load port to the physical load port, and instructing the carrier transport system to perform a transporting operation to and from the virtual load port on an assumption that the virtual load port really exists.

According to the invention, with the virtual load port control device interposed between the physical load port control device and the carrier transport system of a common substrate treating apparatus, a virtual load port can be allotted to the physical load port, and the carrier transport system can be instructed to perform a transporting operation to and from the virtual load port on an assumption that the virtual load port really exists. Therefore, the carrier transport system can be made to perform a transporting operation for the common substrate treating apparatus or an existing substrate treating apparatus as if there were more physical load ports than the actual number thereof. As a result, the efficiency of transporting the pods can easily be improved also for the common substrate treating apparatus or the existing substrate treating apparatus.

This invention further provides a load port control apparatus in a substrate treating system with a substrate treating apparatus having a substrate treating unit for carrying out predetermined treatments of substrates, a physical load port for receiving pods for storing the substrates, the load port transferring the pods to and from the substrate treating unit, and an internal buffer interposed between the substrate treating unit and the load port for transferring the substrates to and from the substrate treating unit, transferring the pods to and from the load port, and storing the pods transferred, a carrier transport system for transferring the pods to and from the load port, and a host computer for communicating with the substrate treating apparatus and the carrier transport system, and instructing the carrier transport system to transport the pods according to a situation of the substrate treating apparatus, the load port control apparatus comprising a virtual load port management unit for allotting a plurality of virtual load ports to the physical load port, and causing the carrier transport system and the host computer to treat the plurality of virtual load ports as a plurality of physical load ports.

According to this invention, the virtual load port management unit allots a plurality of virtual load ports to the physical load port. Further, the virtual load port management unit causes the carrier transport system and the host computer to treat the plurality of virtual load ports as a plurality of physical load ports. Therefore, the pods can be transported as if there were more load ports than the number of physical load ports, and the number of load ports can in appearance be increased. As a result, the load port control apparatus which is capable of improving the efficiency of transporting the pods can be realized while holding down apparatus cost, without increasing the mechanical components of the substrate treating apparatus.

In this invention, the virtual load port management unit may have a conversion table specifying a correspondence relationship between the plurality of virtual load ports and the physical load port, and when the plurality of virtual load ports are set for loading purposes, (A1) the virtual load port management unit reports to the host computer whether each of the virtual load ports is available for loading; (A2) the host computer instructs the carrier transport system to load a pod into one of the virtual load ports; (A3) the carrier transport system holding the pod moves to the substrate treating apparatus in order to transport the pod to the designated one of the virtual load ports; (A4) the carrier transport system, in order to start loading the pod into the one virtual load port, notifies the virtual load port management unit of loading of the pod into the one virtual load port; (A5) the virtual load port management unit matches the one virtual load port with the physical load port based on the conversion table; (A6) the virtual load port management unit notifies the host computer that loading of the pod to the one virtual load port has been started; (A7) the virtual load port management unit accepts the loading into the virtual load port, and sends a load request to the carrier transport system; (A8) the carrier transport system transports the pod to the physical load port allotted to the one virtual load port; (A9) the substrate treating apparatus transports the pod loaded into the one virtual load port to the internal buffer; and (A10) when notifying the host computer of a situation of loading into the one virtual load port in the is loading step, the virtual load port management unit notifies the host computer that a different virtual load port allotted to the physical load port corresponding to the one virtual load port is available for loading, from a point of time when the carrier transport system starts moving to the substrate treating apparatus in order to transport the one designated pod, until before the one designated pod is placed on the physical load port corresponding to the one virtual load port, and notifies the host computer that the different virtual load port allotted to the physical load port corresponding to the one virtual load port is available for loading, at a point of time when the pod begins to be transported to the internal buffer from the physical load port corresponding to the one virtual load port.

At the time of loading, the virtual load port management unit notifies the host computer of a situation of loading into one virtual load port. At this time, the virtual load port management unit notifies the host computer that a different virtual load port allotted to the physical load port corresponding to the one virtual load port is available for loading, from a point of time when the carrier transport system starts moving to the substrate treating apparatus in order to transport the one designated pod, until the one designated pod is placed on the physical load port corresponding to the one virtual load port. Further, the virtual load port management unit notifies the host computer that the different virtual load port allotted to the physical load port corresponding to the one virtual load port is available for loading, at a point of time when the pod begins to be transported to the internal buffer from the physical load port corresponding to the one virtual load port. Therefore, also in the conventionally occupied periods at the time of loading, the host computer can give loading instructions, thereby to realize an efficient loading process.

In this invention, the virtual load port management unit may have a conversion table specifying a correspondence relationship between the plurality of virtual load ports and the physical load port, and when the plurality of virtual load ports are set for unloading purposes, (B1) the host computer instructs the substrate treating apparatus to deliver a designated pod to one of the virtual load ports; (B2) the substrate treating apparatus, when the designated pod can be delivered to the one virtual load port, notifies the host computer that the pod is ready for unloading; (B3) the host computer instructs the carrier transport system to transport the designated pod; (B4) the carrier transport system moves to the substrate treating apparatus having the designated pod; (B5) the carrier transport system, in order to unload the designated pod from the one virtual load port, instructs the virtual load port management unit to deliver the pod to the one virtual load port; (B6) the virtual load port management unit matches the one virtual load port with the physical load port based on the conversion table; (B8) the substrate treating apparatus delivers the designated pod to the physical load port allotted to the one virtual load port; (B9) the substrate treating apparatus sends an unload request to the carrier transport system; (B10) the carrier transport system unloads the pod from the one virtual load port; and (B11) when notifying the host computer of a situation of unloading from the one virtual load port during the unloading process, the virtual load port management unit is capable of notifying the host computer that a different virtual load port allotted to the physical load port corresponding to the one virtual load port is available for unloading.

At the time of unloading, the virtual load port management unit notifies the host computer of a situation of unloading from one virtual load port. At this time, the virtual load port management unit is capable of notifying the host computer that a different virtual load port allotted to the physical load port corresponding to the one virtual load port is available for unloading. Therefore, also in the conventionally occupied period at the time of unloading, the host computer can give unloading instructions, thereby to realize an efficient unloading process.

In this invention, the virtual load port management unit may set the virtual load ports only for loading. The virtual load port management unit may set the virtual load ports only for unloading. The virtual load port management unit may set the virtual load ports for loading or unloading.

The virtual load port management unit enables flexible operation by setting the virtual load ports only for loading, only for unloading, or mixing these functions.

This invention further provides a substrate treating system comprising a substrate treating apparatus having a substrate treating unit for carrying out predetermined treatments of substrates, a physical load port for receiving pods for storing the substrates, the load port transferring the pods to and from the substrate treating unit, and an internal buffer interposed between the substrate treating unit and the load port for transferring the substrates to and from the substrate treating unit, transferring the pods to and from the load port, and storing the pods transferred; a carrier transport system for transferring the pods to and from the load port; a host computer for communicating with the substrate treating apparatus and the carrier transport system, and instructing the carrier transport system to transport the pods according to a situation of the substrate treating apparatus; and a load port control device having a virtual load port management unit for allotting a plurality of virtual load ports to the physical load port, and causing the carrier transport system and the host computer to treat the plurality of virtual load ports as a plurality of physical load ports.

According to this invention, the virtual load port management unit of the load port control device allots a plurality of virtual load ports to the physical load port. Further, the virtual load port management unit causes the carrier transport system and the host computer to treat the plurality of virtual load ports as a plurality of physical load ports. Therefore, the pods can be transported as if there were more load ports than the number of physical load ports, and the number of load ports can in appearance be increased. As a result, the substrate treating system which is capable of improving the efficiency of transporting the pods is realized while holding down apparatus cost.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 4 is a schematic view showing the loading process and a notice to a host computer;

FIG. 5 is a schematic view showing the loading process and transport instructions from the host computer;

DESCRIPTION OF THE PREFERRED EMBODIMENTS

An embodiment of this invention will be described hereinafter with reference to the drawings.

Figure 1:
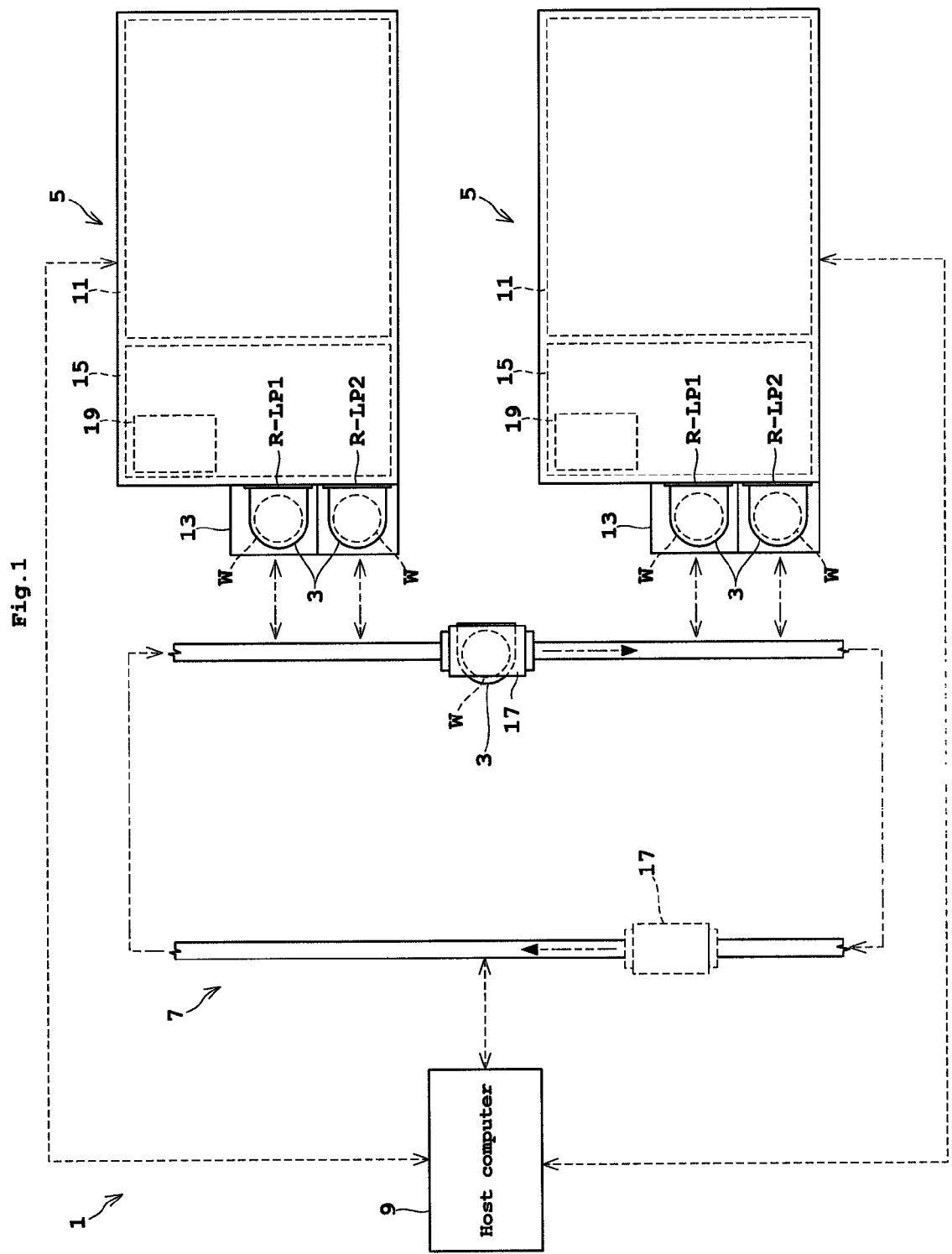
FIG. 1 is a plan view showing an outline of a substrate treating system according to this invention.
Figure 2:
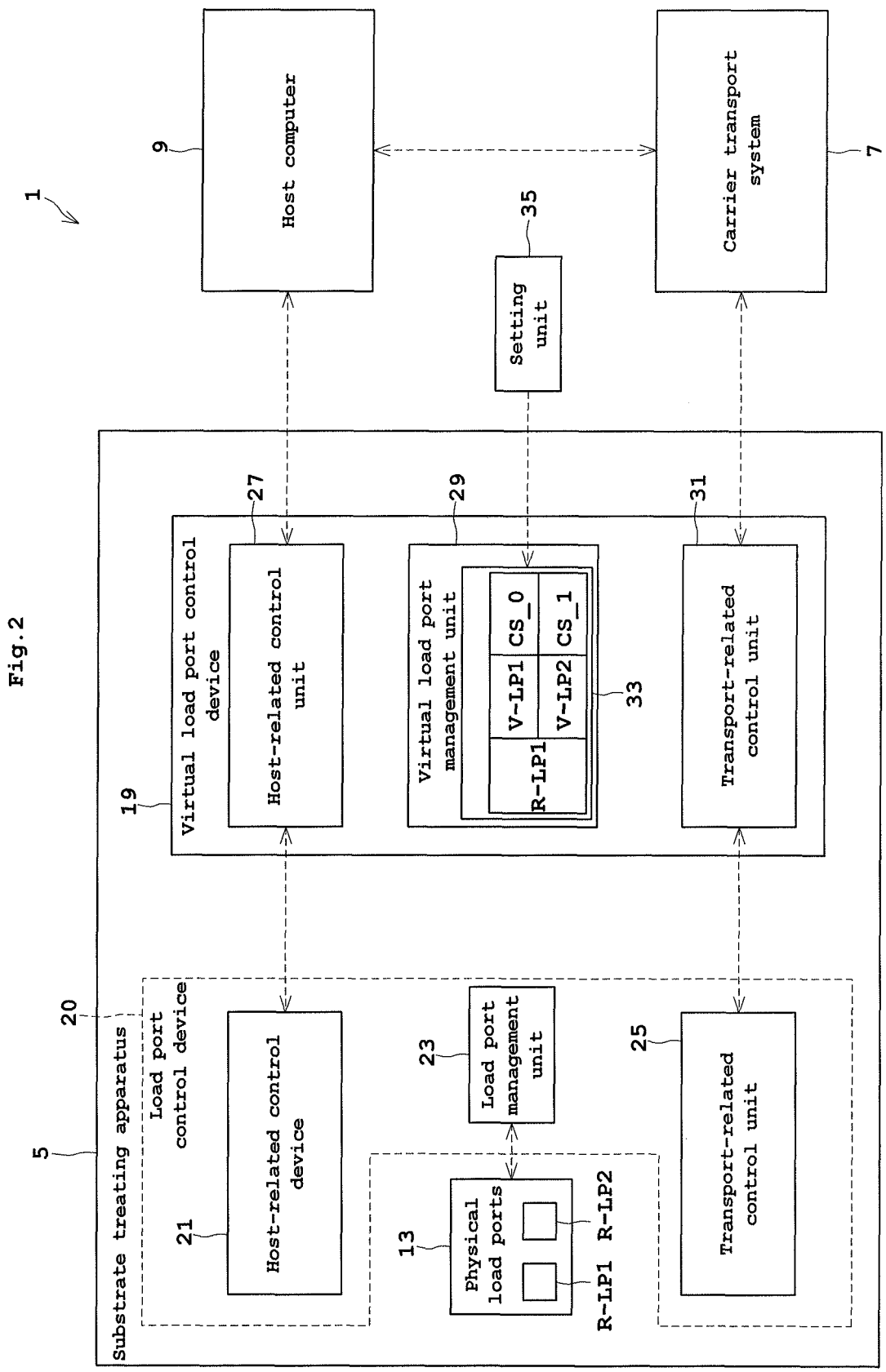
FIG. 2 is a block diagram showing an outline construction of the substrate treating system.

FIG. 1 is a plan view showing an outline of a substrate treating system according to this invention. FIG. 2 is a block diagram showing an outline construction of the substrate treating system.

The substrate treating system 1 in this embodiment has functions to receive wafers W along with FOUPs 3, treat the wafers W and deliver the treated wafers W along with the FOUPs 3. FOUP is an abbreviation of Front Opening Unified Pod, and the FOUPs 3 store wafers W in a sealed condition to secure clean environment.

This substrate treating system 1 includes substrate treating apparatus 5, a carrier transport system 7, and a host computer 9. It is general practice to provide a plurality of substrate treating apparatus 5, and FIG. 1 shows two substrate treating apparatus 5 by way of example.

Each substrate treating apparatus 5 has a substrate treating unit 11, a load port 13, and an internal buffer 15. The substrate treating unit 11 carries out predetermined treatments of the wafers W taken out of the FOUPs 3. The predetermined treatments include cleaning treatment, etching treatment, and photoresist removing treatment, for example. The load port 13 serves for transferring the FOUPs 3 between the substrate treating apparatus 5 and the carrier transport system 7. In this example, the load port 13 includes two physical load ports R-LP1 and R-LP2. The internal buffer 15 is disposed between the substrate treating unit 11 and the load port 13 for transferring FOUPs 3 to and from the load port 13, and transferring the wafers W taken out of the FOUPs 3 to and from the substrate treating unit 11. The internal buffer 15 has a buffering function to store temporarily the FOUPs 3 loaded from the load port 13 when the substrate treating unit 11 is in a state not capable of accepting the wafers W, and store temporarily the FOUPs 3 when the load port 13 is in a state not capable of accepting delivery of the FOUPs 3.

The above FOUPs 3 correspond to the "pods" in this invention.

The carrier transport system 7 transports FOUPs 3 between the substrate treating apparatus 5 and a depository (not shown) which stores a plurality of FOUPs 3, or to and from other substrate treating apparatus. The carrier transport system 7 may be AMHS (Automated Material Handling Systems) such as AGV (Automatic Guided Vehicle) or OHT (Overhead Hoist Transport), for example. This embodiment employs a construction, as an example, in which a plurality of OHTs 17 circulate in an area adjacent the two substrate treating apparatus 5.

The host computer 9 communicates with the substrate treating apparatus 5 and carrier transport system 7 described above. The host computer 9 instructs for transportation of the FOUPs 3 by the carrier transport system 7 according to situations of the substrate treating apparatus 5. The "transportation" here refers to "loading" which is transportation for carrying the FOUPs 3 into the substrate treating apparatus 5, and "unloading" which is transportation for carrying the FOUPs 3 out of the substrate treating apparatus 5.

As shown in FIG. 2, each substrate treating apparatus 5 includes a load port control device 20 formed of a host-related control unit 21, a load port management unit 23, and a transport-related control unit 25. These host-related control unit 21, load port management unit 23, and transport-related control unit 25 constituting the load port control device 20 have the same functions as included in a common substrate treating apparatus. That is, in a common substrate treating system, the load port management unit 23 is connected to the physical load ports R-LP1 and R-LP2 of the load port 13 and the internal buffer 15 provided for each substrate treating apparatus 5, to recognize states of these components through communication therewith and manage them such as by controlling operations thereof. In the common substrate treating system, the host-related control unit 21 is connected to the host computer 9 to communicate a request for loading FOUPs 3 to the host computer 9, for example, by referring to the states of the physical load ports R-LP1 and R-LP2 recognized by the load port management unit 23. In the common substrate treating system, the transport-related control unit 25 is connected to the carrier transport system 7 to perform communications relating to control of loading of the FOUPs 3 (such as CS signals to be described hereinafter) with the carrier transport system 7 by referring to the states of the physical load ports R-LP1 and R-LP2 recognized by the load port management unit 23, for example.

In this embodiment, as distinct from the common substrate treating system noted above, a virtual load port control device 19 is interposed and connected between the host-related control unit 21 and the host computer 9, and between the transport-related control unit 25 and the carrier transport system 7. That is, the substrate treating system 1 in this embodiment is constructed by post-installing the virtual load port control device 19 between the common substrate treating apparatus and the host computer 9 and carrier transport system 7. Here, the virtual load port control device 19 connected in post-installation is considered also to be included in the substrate treating apparatus 5.

The load port control device 19 allots a plurality of virtual load ports to each of the two physical load ports R-LP1 and R-LP2. The load port control device 19 causes the carrier transport system 7 and host computer 9 to treat the plurality of virtual load ports as a plurality of physical load ports. In other words, the virtual load port control device 19 carries out signal processing and communication in a way to indicate to the carrier transport system 7 and host computer 9 as if there were more physical load ports than the two real physical load ports R-LP1 and R-LP2.

Regarding operations of the host computer 5 and carrier transport system 7 which behave as if there were more physical load ports than there actually are, the host-related control unit 21 and transport-related control unit 25 allot the required responses to the two real physical load ports R-LP1 and R-LP2. Specifically, the virtual load port control device 19 includes a host-related control unit 27, a virtual load port management unit 29, and a transport-related control unit 31. The virtual load port management unit 29 has a conversion table storage unit 33. The conversion table storage unit 33 stores, inputted thereto beforehand, a "conversion table" which specifies a correspondence relationship between physical load ports and virtual load ports. This conversion table is set as appropriate by the operator through a setting unit 35.

The host-related control unit 27 receives a notice concerning the physical load ports R-LP1 and R-LP2 from the load port management unit 23, refers to the information in the virtual load port management unit 29, converts the notice into a notice concerning the virtual load ports allotted to such physical load ports, and transmits the converted notice to the host computer 9.

The transport-related control unit 31 receives a notice concerning virtual load ports V-LP1-V-LP4 from the carrier transport system 7, refers to the information in the virtual load port management unit 29, converts the notice into a notice concerning the physical load ports allotted to such virtual load ports, and transmits the converted notice to the transport-related control unit 25. Conversely, the transport-related control unit 31 receives a notice concerning the physical load ports R-LP1 and R-LP2 from the transport-related control unit 25, refers to the information in the virtual load port management unit 29, converts the notice into a notice concerning the virtual load ports allotted to such physical load ports, and transmits the converted notice to the carrier transport system 7.

<A: Loading Process>

Next, a flow of "loading" of the FOUPs 3 by the above substrate treating system 1 will be described with reference to FIGS. 3-13 and FIG. 26.

Figure 3:
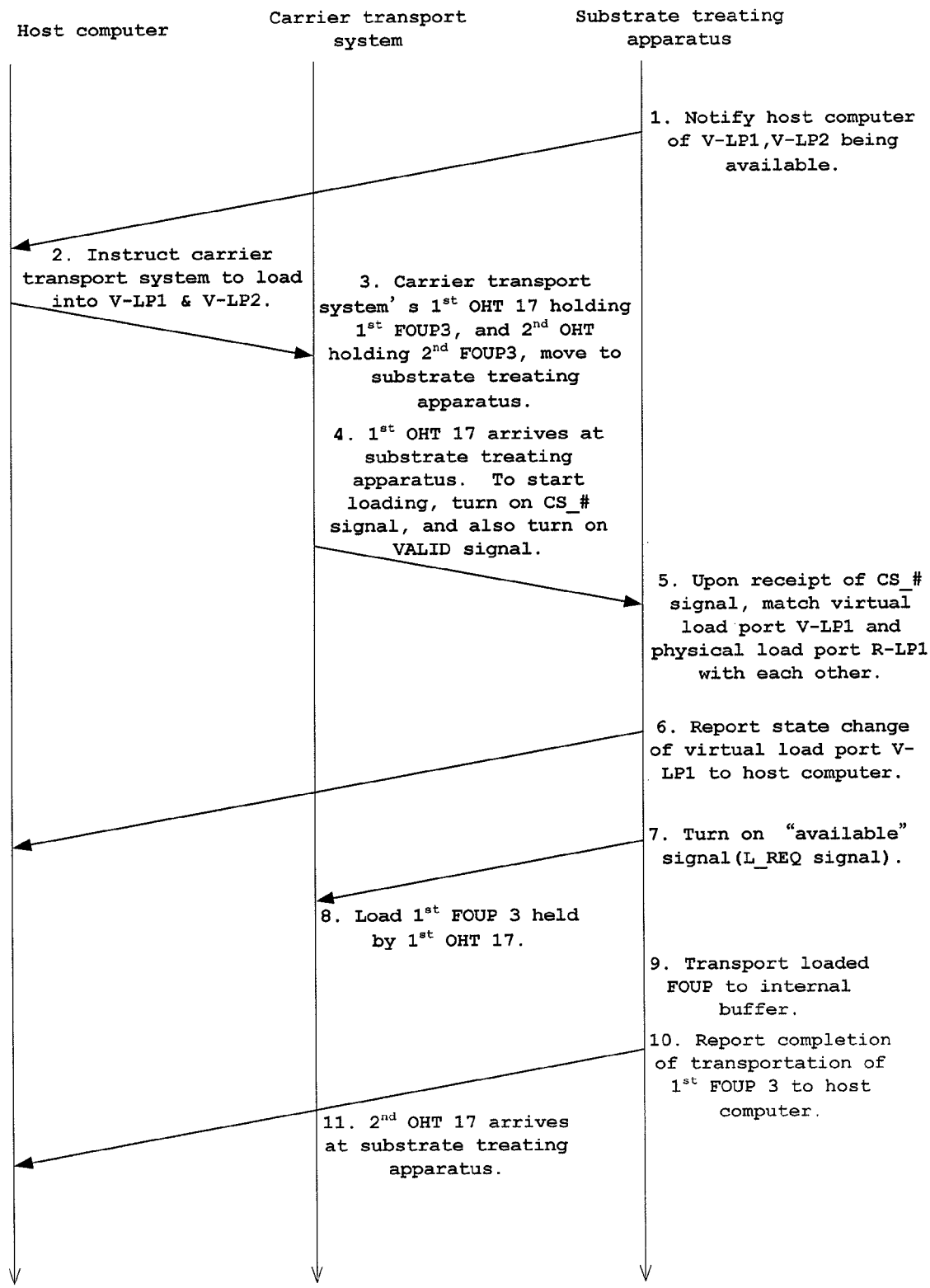
FIG. 3 is a time chart showing a sequence of a loading process.
Figure 6:
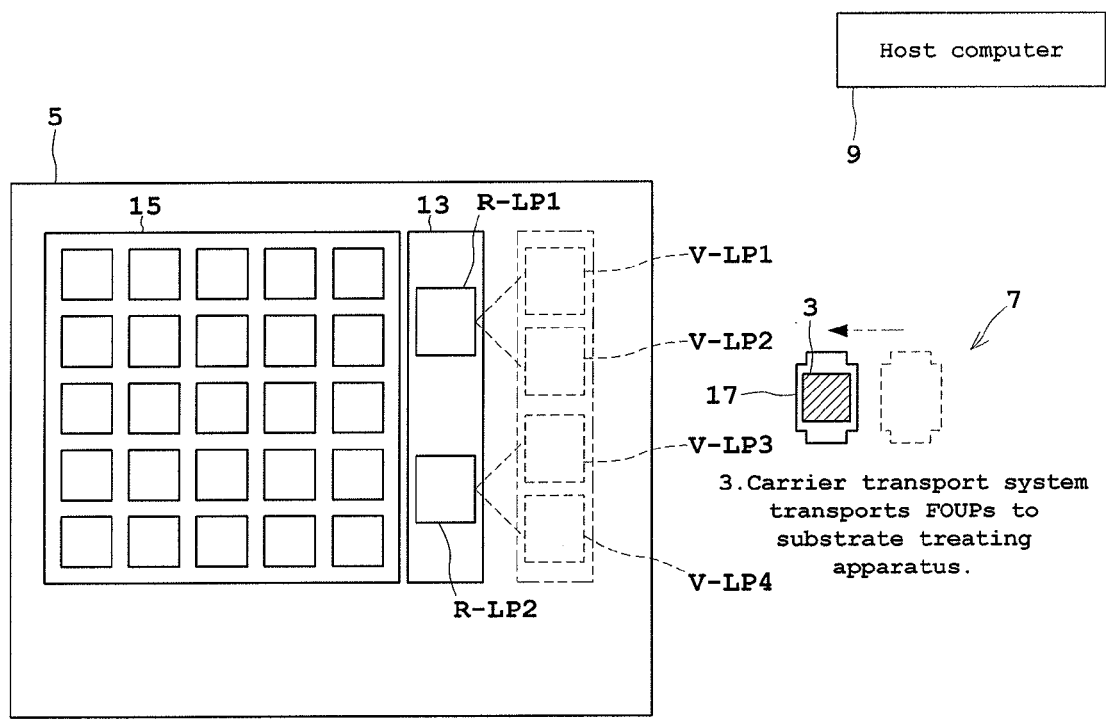
FIG. 6 is a schematic view showing the loading process and a movement of a carrier transport system.
Figure 7:
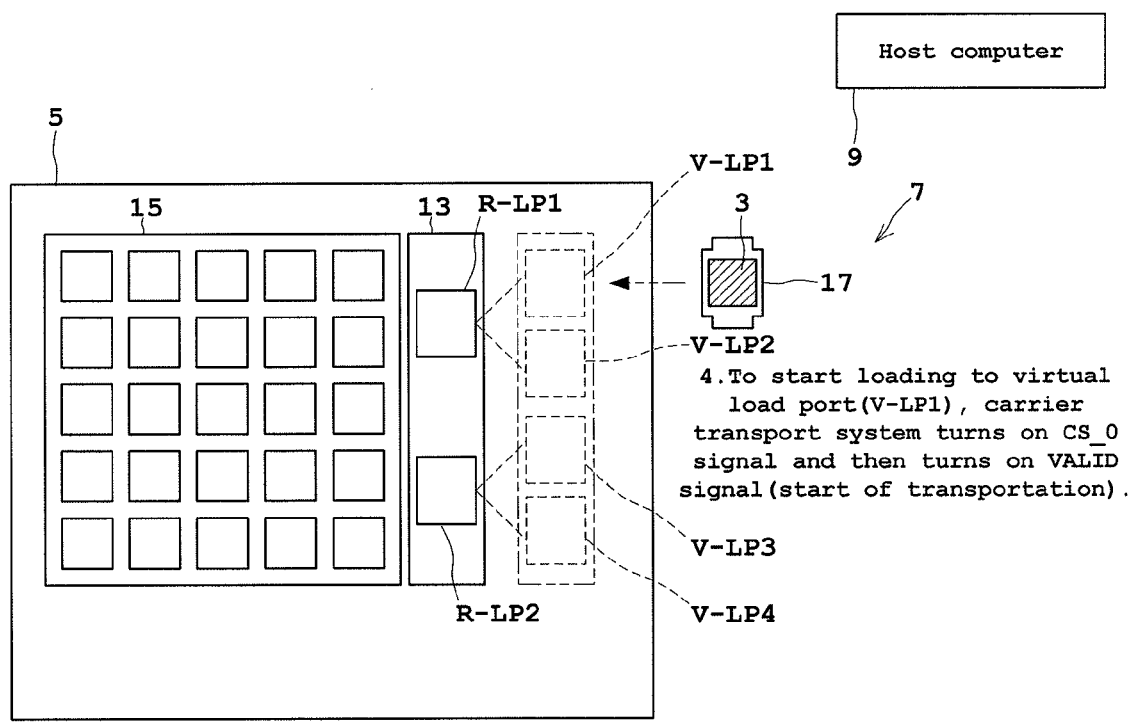
FIG. 7 is a schematic view showing the loading process and a start of loading by the carrier transport system.
Figure 8:
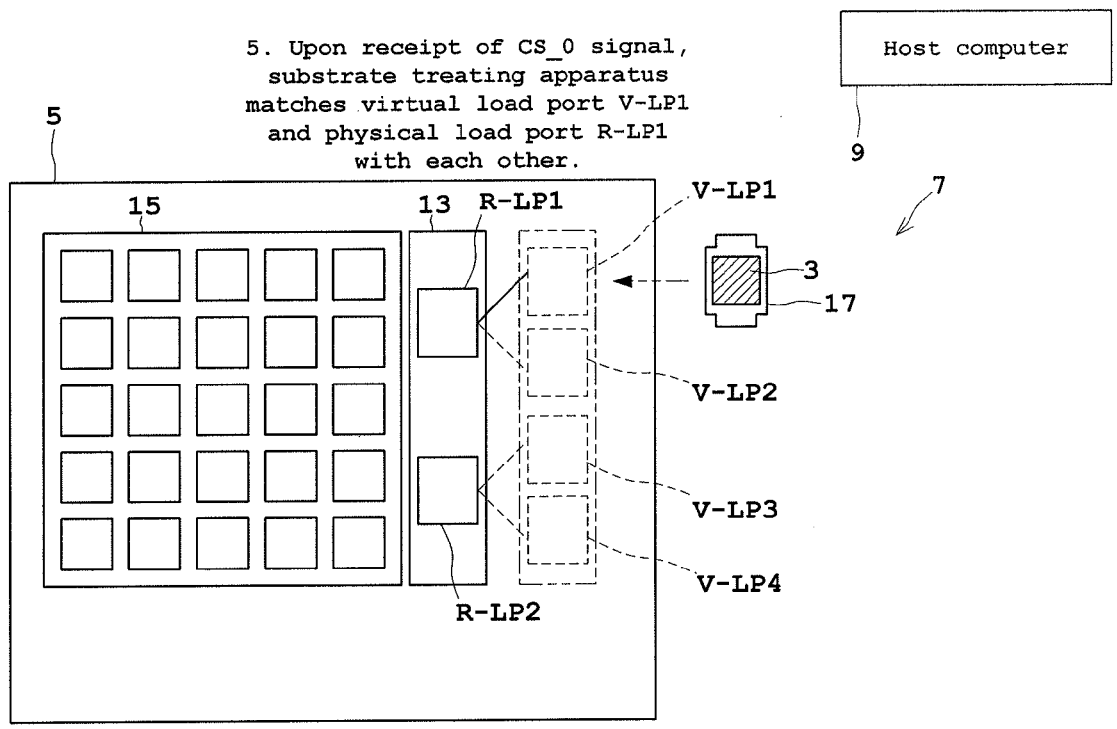
FIG. 8 is a schematic view showing the loading process and matching of load ports.
Figure 9:
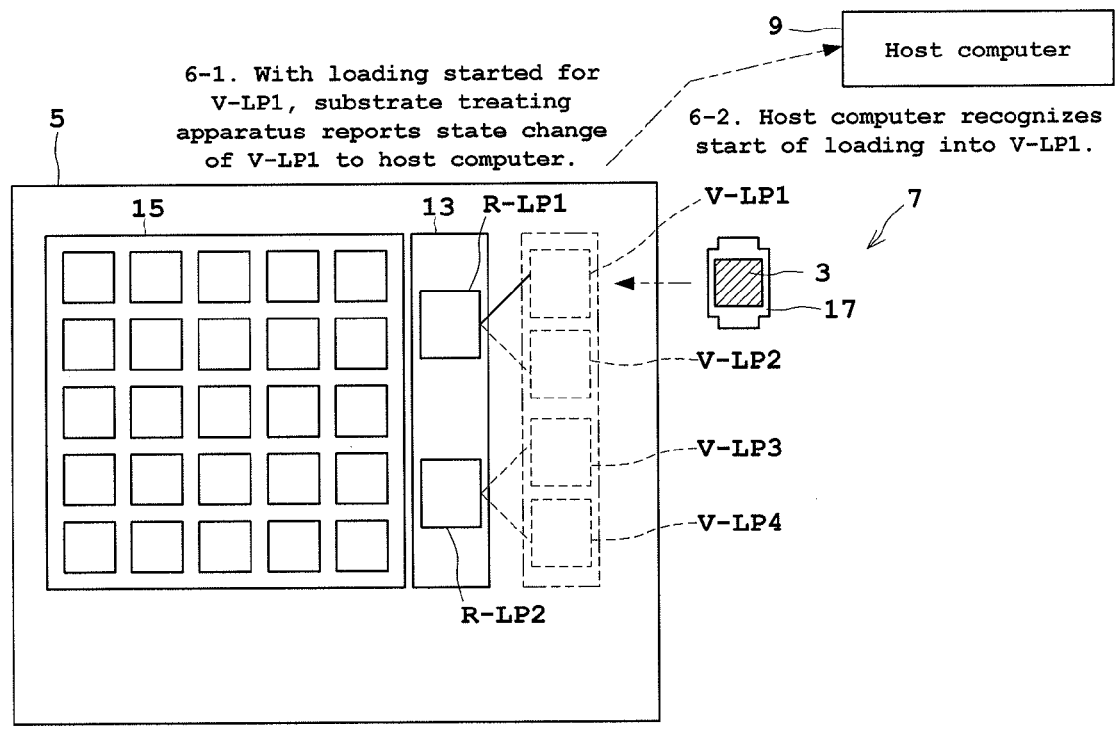
FIG. 9 is a schematic view showing the loading process and a report on a state change of a virtual load port.
Figure 10:
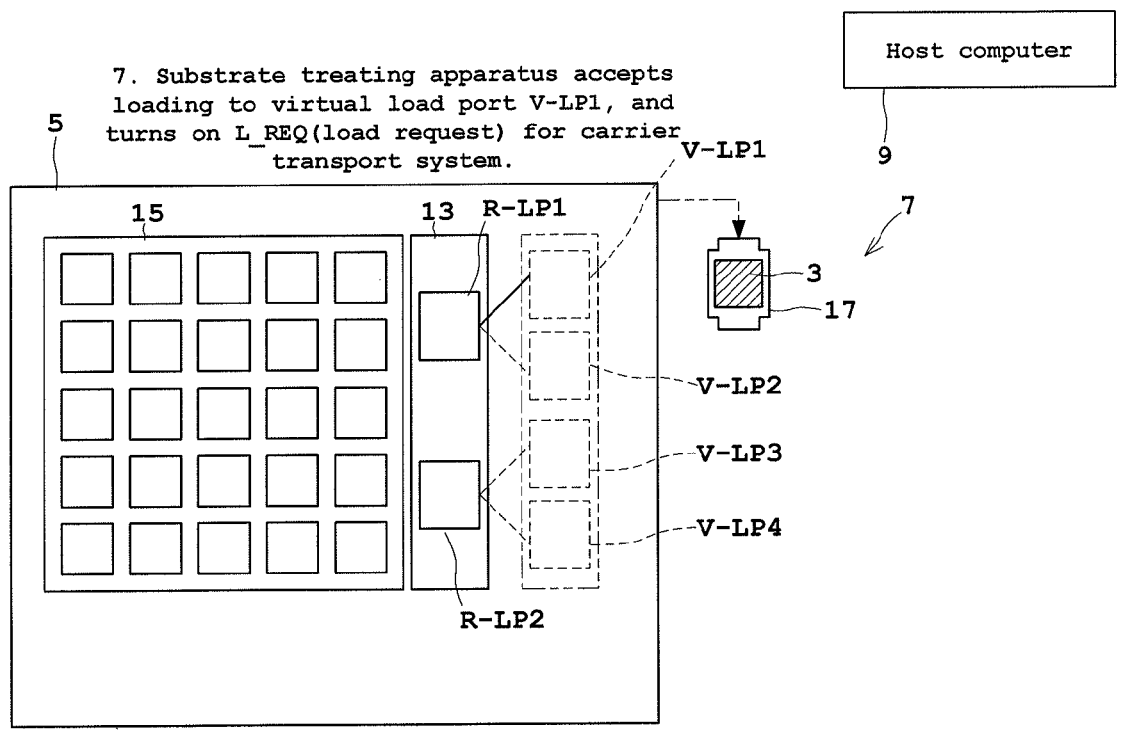
FIG. 10 is a schematic view showing the loading process and a load reception.
Figure 11:
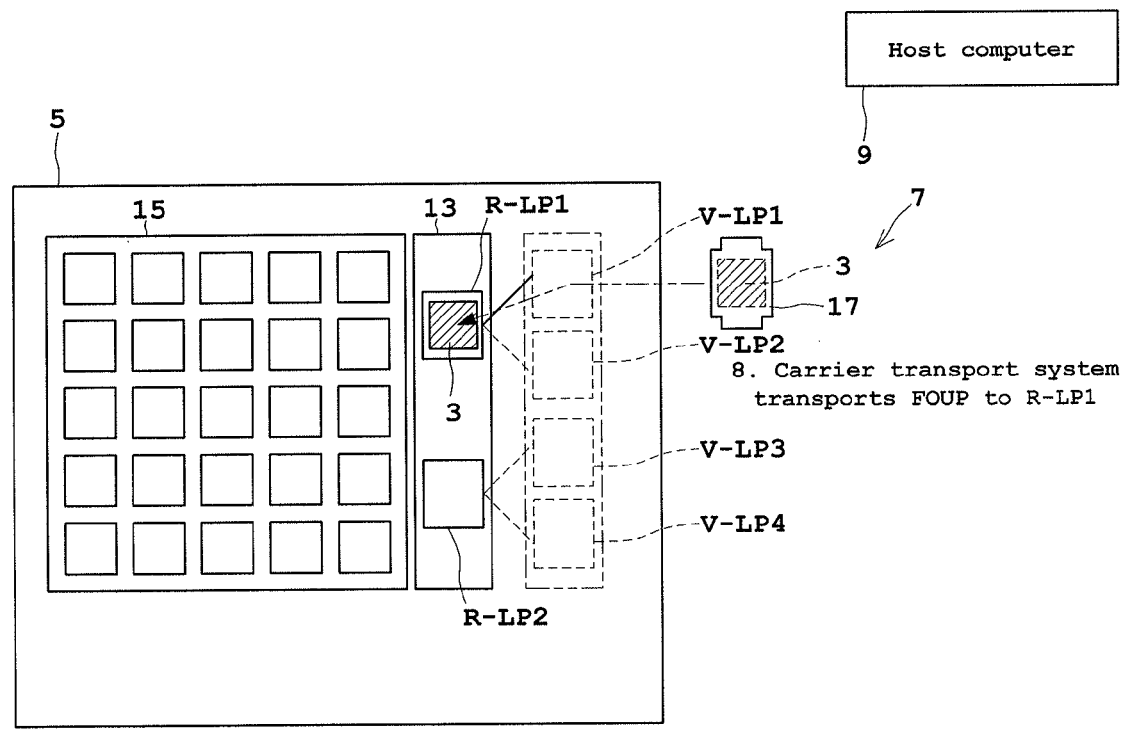
FIG. 11 is a schematic view showing the loading process and a movement of the carrier transport system.
Figure 12:
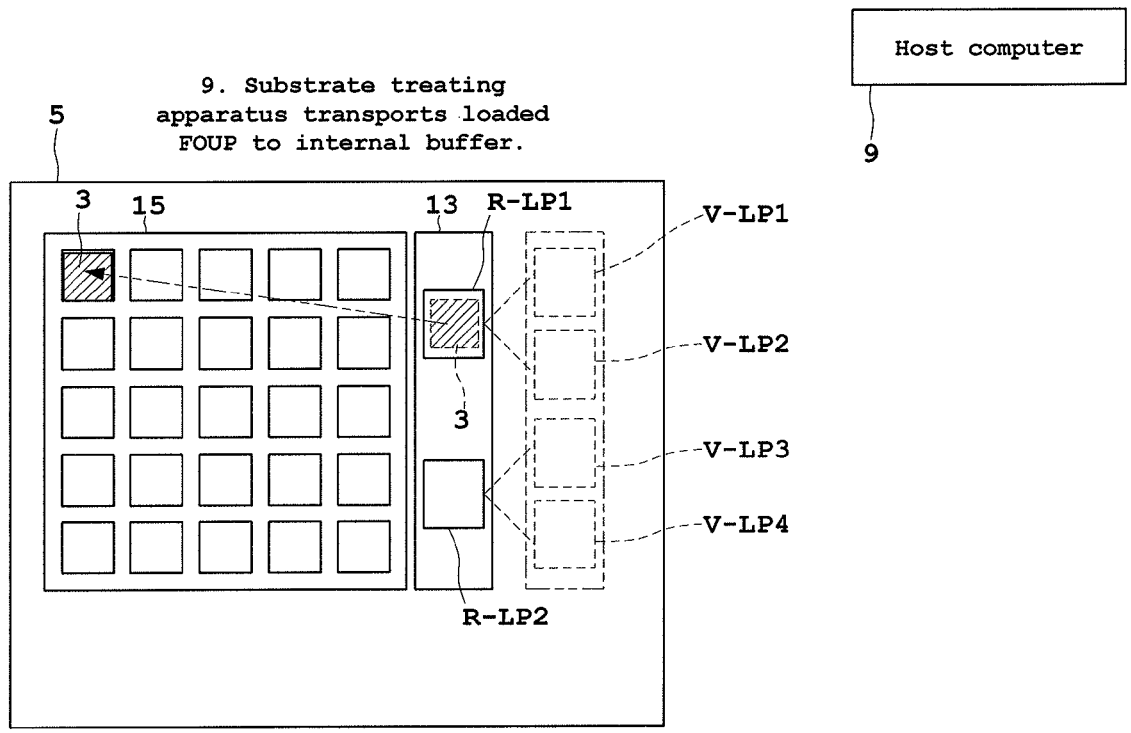
FIG. 12 is a schematic view showing the loading process and movement of a FOUP to an internal buffer.
Figure 13:
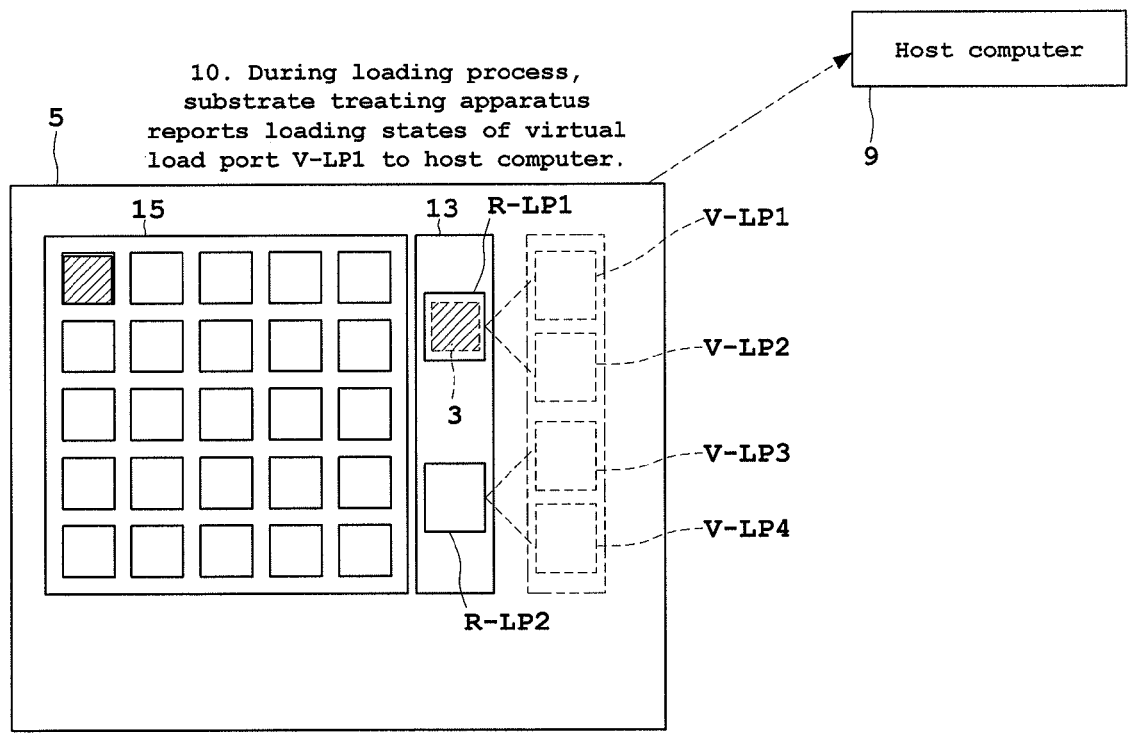
FIG. 13 is a schematic view showing the loading process and a report on a loading situation.
Figure 26:
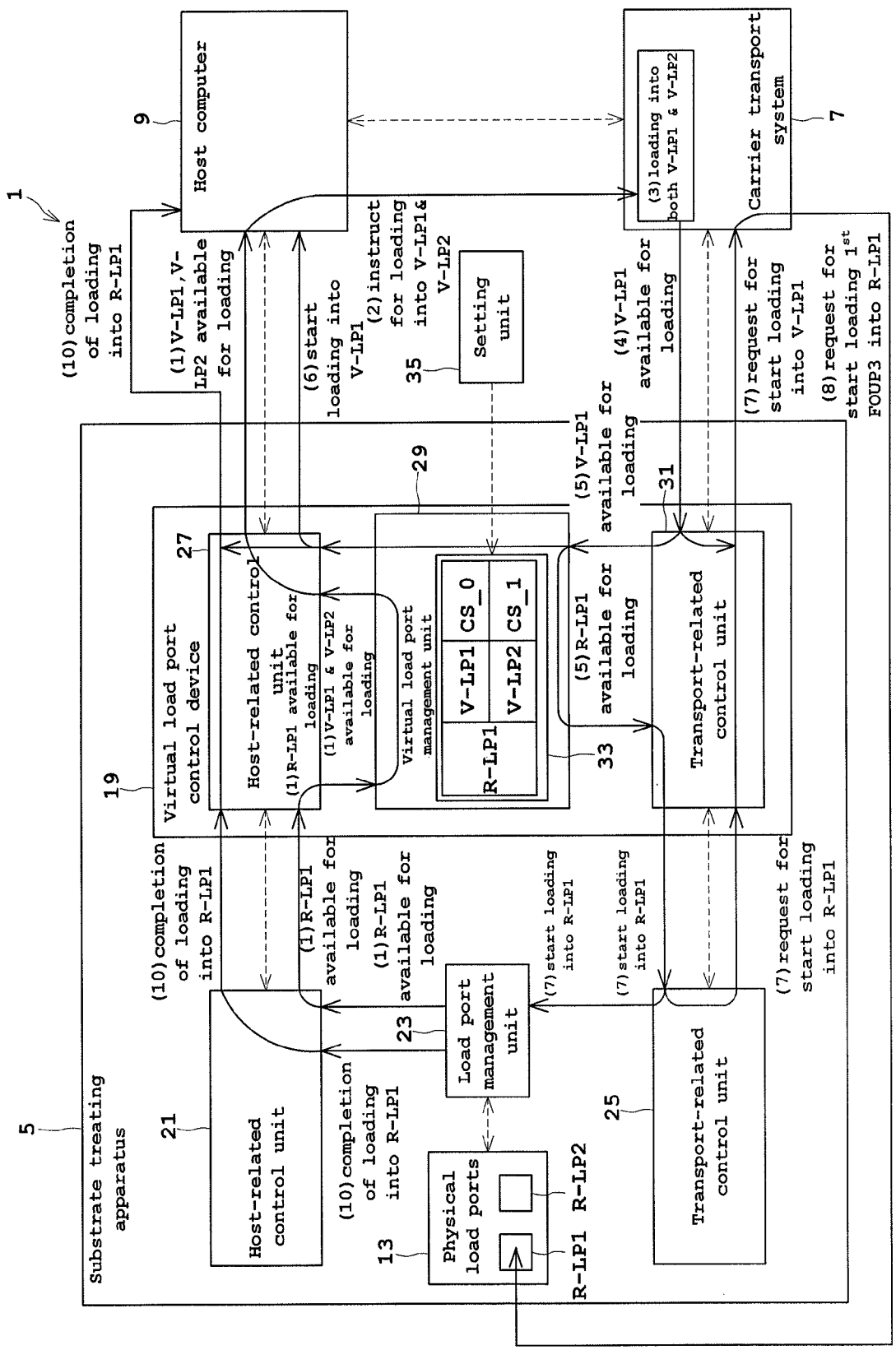
FIG. 26 is a schematic view showing an exchange of signals among the components during the loading process.

FIG. 3 is a time chart showing a sequence of a loading process. FIGS. 4-13 are schematic views showing the loading process. FIG. 4 shows a notice to the host computer. FIG. 5 shows transport instructions from the host computer. FIG. 6 shows a movement of the carrier transport system. FIG. 7 shows a start of loading by the carrier transport system. FIG. 8 shows matching of the load ports. FIG. 9 shows a report on a state change of a virtual load port. FIG. 10 shows a load reception. FIG. 11 shows a movement of the carrier transport system. FIG. 12 shows movement of a FOUP to the internal buffer. FIG. 13 shows a report on a loading situation. FIG. 26 is a schematic view showing an exchange of signals among the components during the loading process.

In the following description, it is assumed that, as shown in FIG. 4, the physical load port R-LP1 is matched with two virtual load ports V-LP1 and V-LP2, and the physical load port R-LP2 with two virtual load ports V-LP3 and V-LP4. This correspondence relationship is specified on the conversion table in the conversion table storage unit 33 noted hereinbefore. It is also assumed here that the two virtual load ports V-LP1 and V-LP2 are set for loading purposes. To facilitate understanding, description will be made hereinafter only of the virtual load ports V-LP1 and V-LP2.

1. The substrate treating apparatus 5 notifies the host computer 9 as to whether the two virtual load ports V-LP1 and V-LP2 are available for loading (FIG. 4). Specifically, the host-related control unit 27 of the virtual load port control device 19 refers to the virtual load port management unit 29, and notifies the host computer 9 that the load ports named virtual load ports V-LP1 and V-LP2 are available for loading.

To describe this in greater detail, the load port management unit 23 which manages the physical load port R-LP1 first recognizes the state of the physical load port R-LP1 as "available for loading". In response to this, the host-related control unit 21 refers to the recognition by the load port management unit 23 and outputs an "available" notice. With the conventional common construction, this output would be transmitted directly to the host computer 9. However, in this invention, the "available" notice outputted from the host-related control unit 21 is transmitted to the host-related control unit 27 of the virtual load port control unit 19. Upon receipt of this notice, the load port management unit 29 refers to the conversion table stored in the internal conversion table storage unit 33, and recognizes that the physical load port R-LP1 notified as "available" is matched with the virtual load ports V-LP1 and V-LP2. Then, the virtual load port management unit 29 notifies the host-related control unit 27 that, instead of the physical load port R-LP1 notified as "available", both virtual load ports V-LP1 and V-LP2 are to be treated as "available". Based on such notice, the host-related control unit 27 notifies the host computer 9 that both virtual load ports V-LP1 and V-LP2 are "available".

2. Having received the above notice, the host computer 9 instructs the carrier transport system 7 to load two FOUPs 3 to be processed by the substrate treating apparatus 5, into both virtual load ports V-LP1 and V-LP2, respectively (FIG. 5).

3. The carrier transport system 7 fetches a first and a second FOUPs 3 from a substrate treating apparatus at an upstream stage or from the depository. With a first OHT 17 holding the first FOUP 3 and a second OHT 17 holding the second FOUP 3, each starts moving toward the substrate treating apparatus 5 from which the loading instructions have originated. It is assumed here that both the first OHT 17 and second OHT 17 carry out the loading into the same substrate treating apparatus 5, and that the first OHT 17 is in a position to reach the substrate treating apparatus 5 earlier, with the second OHT 17 in a position to reach the substrate treating apparatus 5 thereafter.

4. When the first OHT 17 arrives at the substrate treating apparatus 5, the carrier transport system 7 notifies the substrate treating apparatus 5 that the first FOUP 3 will be loaded into the virtual load port V-LP1 (FIG. 7). Specifically, the carrier transport system 7 turns on CS_0 signal, further turns on a VALID signal indicating a transport start, and transmits the signals to the transport-related control unit 31. The CS signal is a carrier stage signal used for designation of the load ports, and is prescribed by SEMI standard E84.

5. The substrate treating apparatus 5 refers to the CS_0 signal (indicating the virtual load port V-LP1) received from the carrier transport system 7 and the conversion table, and matches the virtual load port V-LP1 with one corresponding physical load port R-LP1 (FIG. 8). Specifically, based on the signal received by the transport-related control unit 31, the virtual load port management unit 29 performs the matching.

6-1. The substrate treating apparatus 5 reports to the host computer 9 the start of loading into the virtual load port V-LP1 as a change of state (FIG. 9). Specifically, the virtual load port management unit 29 reports it to the host computer 9 through the host-related control unit 27.

6-2. The host computer 9 having received the report recognizes that loading has started at the virtual load port V-LP1 (FIG. 9).

7. In order to accept in the physical load port R-LP1 the first FOUP 3 transported by the carrier transport system 7 toward the virtual load port V-LP1, the substrate treating apparatus 5 instructs the physical load port R-LP1 to accept the first FOUP 3, and requests the carrier transport system 7 to carry out a loading operation (FIG. 10). Specifically, the virtual load port management unit 29 communicates instructions to the transport-related control unit 25 through the transport-related control unit 31 for loading into the physical load port R-LP 1. Upon receipt of this communication, the transport-related control unit 25 instructs the load port management unit 23 to carry out an operation for loading into the physical load port R-LP1, and requests the transport-related control unit 31 to make a "loading start" for the physical load port R-LP1. Such a request signal would be transmitted to the carrier transport system 7 if this were a conventional substrate treating system. In this invention, this request signal is transmitted to the transport-related control unit 31 of the virtual load port control device 19.

The transport-related control unit 31 can recognize that the "loading start" request signal from the transport-related control unit 25 is a response to the notice of loading of the first FOUP 3 into the virtual load port V-LP1 received from the carrier transport system 7 in step 4 above. Based on such recognition, the transport-related control unit 31 transmits such "loading start" request signal to the carrier transport system 7 as "loading start" request relating to the virtual load port V-LP 1. As such request signal, the transport-related control unit 31 turns on L_REQ signal for the carrier transport system 7. L_REQ stands for load request.

8. In response to the "loading start" request from the transport-related control unit 31, the carrier transport system carries out an operation for transporting the first FOUP 3 held by the first OHT 17 toward the virtual load port V-LP1. The carrier transport system 7 has an actual position of the physical load port R-LP1 set thereto as position information on the virtual load port V-LP1 which is the destination of the transportation at this time. Thus, the transportation to the virtual load port V-LP1 by the carrier transport system 7 will be performed in reality as transportation to the physical load port R-LP1 (FIG. 11).

9. The substrate treating apparatus 5 transports the first FOUP 3 loaded into the physical load port R-LP1 to an appropriate position in the internal buffer 15 (FIG. 12).

10. In the above loading process, the substrate treating apparatus 5 reports to the host computer 9 completion of the loading of the first FOUP 3 into the physical load port R-LP 1 as completion of the loading into the virtual load port V-LP1 (FIG. 13). Specifically, the load port management unit 23 recognizes the situation of the physical load port R-LP1, and reports it to the host computer 9 through the host-related control unit 21 and host-related control unit 27.

At this time, the host-related control unit 21 transmits to the host-related control unit 27 the "loading completion" report on the physical load port R-LP1 received from the load port management unit 23. The host-related control unit 27 can recognize that the "loading completion" report from the host-related control unit 21 is a response to the notice of the start of loading the first FOUP 3 into the virtual load port V-LP1, which notice has been received from the virtual load port management unit 29 in step 6 above. Based on such recognition, the host-related control unit 27 transmits the "loading completion" report to the host computer 9 as a "loading completion" report on the virtual load port V-LP 1.

When, in step 9 above, the first FOUP 3 loaded into the physical load port R-LP1 has been transported to the internal buffer 15, the physical load port R-LP1 becomes capable of accepting a FOUP 3 again. Thus, as in step 1 above, the load port management unit 23 recognizes the state of the physical load port R-LP1 as "available". Consequently, the host-related control unit 21 refers to the recognition by the load port management unit 23, and transmits an "available" notice to the host-related control unit 27 of the virtual load port control device 19. In response thereto, the host-related control unit 27 recognizes that the virtual load port V-LP 1 has become "available", as in the case of the above "loading completion" report, and notifies this to the host computer 9. Such "available" notice will be made immediately or with a slight delay after the above "loading completion" report, depending on the timing of transportation of the FOUP 3 to the internal buffer 15. In the described case, the "available" state of the virtual load port V-LP2 has already been reported in step 1 above, and accordingly, the second OHT 17 has already started transporting the second FOUP 3. Here, therefore, no new notice is made with regard to the virtual load port V-LP2.

11. When the second OHT 17 arrives at the substrate treating apparatus 5 slightly later than the first OHT 17, the carrier transport system 7, as in step 4 above, notifies the substrate treating apparatus 5 that the second FOUP 3 will be loaded into the virtual load port V-LP2. Specifically, the carrier transport system 7 turns on CS_1 (indicating the virtual load port V-LP2), further turns on the VALID signal indicating a transport start, and transmits the signals to the transport-related control unit 31. Subsequently, as described hereinbefore, a loading into the physical load port R-LP1 is carried out as loading into the virtual load port V-LP2.

When there is only one FOUP 3, i.e. the first FOUP 3, to be treated by the substrate treating apparatus 5 at the time of step 2 above, the host computer 9 instructs for transportation to the virtual load port V-LP1, but does not instruct for transportation to the virtual load port V-LP2 immediately. The host computer 9 will wait until a second FOUP 3 to be treated becomes ready.

According to this embodiment, two virtual load ports V-LP1 and V-LP2 are allotted to one physical load port V-LP1, with both of the virtual load ports V-LP1 and V-LP2 being "available", two OHTs 17 can be moved at the same time to transport FOUPs 3 to the respective load ports V-LP1 and V-LP2. Compared with the case of only one OHT 17 engaging in the transporting operation for one physical load port R-LP1, this embodiment can increase the number of FOUPs 3 transportable per unit time. In other words, the time taken for transporting each FOUP 3 can be shortened.

As seen also from FIG. 26, the virtual load port control device 19 handles only signals relating to the physical load port R-LP1 in the communication with the host-related control unit 21 and transport-related control unit 25 which are inherent in the substrate treating apparatus 5, and handles only signals relating to the virtual load ports V-LP1 and V-LP2 in the communication with the host computer 9 and carrier transport system 7. That is, the virtual load port control device 19 is interposed between the substrate treating apparatus 5 and the host computer 9/carrier transport system 7 to carry out matching of the physical load port R-LP1 and the virtual load ports V-LP1 and V-LP2, and conversion of the signals. The controls according to this invention can be implemented easily, without changing in any way the constructions of hardware and software of the conventional substrate treating apparatus 5, host computer 9 and carrier transport system 7, and only by interposing the virtual load port control device 19 in between. The construction of the conventional substrate treating system can easily be reinstated only by removing the virtual load port control device 19.

The virtual load port V-LP2 is another virtual load port matched with the same physical load port R-LP1. In the above loading process, from the point of time when an OHT 17 of the carrier transport system 7 starts moving to the substrate treating apparatus 5 in order to transport one FOUP 3 until the FOUP 3 is actually placed in the physical load port R-LP 1 corresponding to one virtual load port V-LP1, the virtual load port control device 19 reports to the host computer 9 that loading can be made into the virtual load port V-LP2 which is the another virtual load port. Further, at the point of time when the FOUP 3 begins to be transported to the internal buffer 15 from the physical load port R-LP 1 corresponding to the one virtual load port V-LP1, the virtual load port control device 19 reports to the host computer 9 that loading can be made into the virtual load port V-LP2 which is the another virtual load port different from the virtual load port V-LP1, and is matched with the physical load port R-LP1 corresponding to the virtual load port V-LP1.

Thus, during the above periods, the host computer 9 can instruct the carrier transport system 7 to load a FOUP into the physical load port R-LP1 by turning on the CS_1 signal indicating the virtual load port V-LP2. Therefore, also in the conventionally occupied periods, the host computer 9 can give loading instructions, thereby to realize an efficient loading process.

In the above example, the transportation of the preceding (first) FOUP 3 to the virtual load port V-LP1 is completed, this FOUP 3 is taken into the internal buffer 15, and then the following (second) FOUP 3 is loaded into the virtual load port V-LP2 allotted to the same physical load port R-LP1. Therefore, no problem arises in the loading into the same physical load port R-LP 1. If time is consumed in taking in the preceding (first) FOUP 3 and the following (second) FOUP 3 arrives at the same physical load port R-LP1, the following (second) FOUP 3 will be put on standby on the spot. This control is realized, for example, by carrying out the following process. In step 4 above, the notice of starting loading of the first FOUP 3 into the virtual load port V-LP1 is inputted from the carrier transport system 7 to the transport-related control unit 31. Even if a notice of starting loading of the second FOUP 3 to the other virtual load port V-LP2 is inputted immediately thereafter, operation will be suspended instead of proceeding to the next step 5, in response to the notice of starting loading of the second FOUP 3. When the "loading completion" notice to the physical load port R-LP1 of the first FOUP 3 is transmitted to the host-related control unit 27 in step 10 above, the host-related control unit 27 may notify this to the transport-related control unit 31, thereby to cancel this suspended state. In another conceivable process, after the notice of starting loading of the first FOUP 3 to the virtual load port V-LP1 is inputted from the carrier transport system 7 to the transport-related control unit 31 in step 4 above, even if the notice of starting loading to the other virtual load port V-LP2, operation in response to this loading start notice is suspended, instead of proceeding to the next step 5, for at least a predetermined time from the point of time when the notice of starting loading of the first FOUP 3 is inputted (e.g. for a time sufficient to enable the transportation from the load port 13 to the internal buffer 15).

Even if the start of loading of the FOUP 3 is suspended as described above, compared with the conventional substrate treating system in which instructions for loading the next (second) FOUP 3 are given only after the preceding FOUP 3 is taken into the internal buffer 15, making the physical load port R-LP1 available for the next loading, this invention, with the transportation of the next (second) FOUP 3 started early, can carry out a more efficient transportation despite such an idle situation than the prior art.

<B: Unloading Process>

Next, a flow of unloading of FOUPs 3 by the above substrate treating system 1 will be described with reference to FIGS. 14-25 and FIG. 27.

Figure 14:
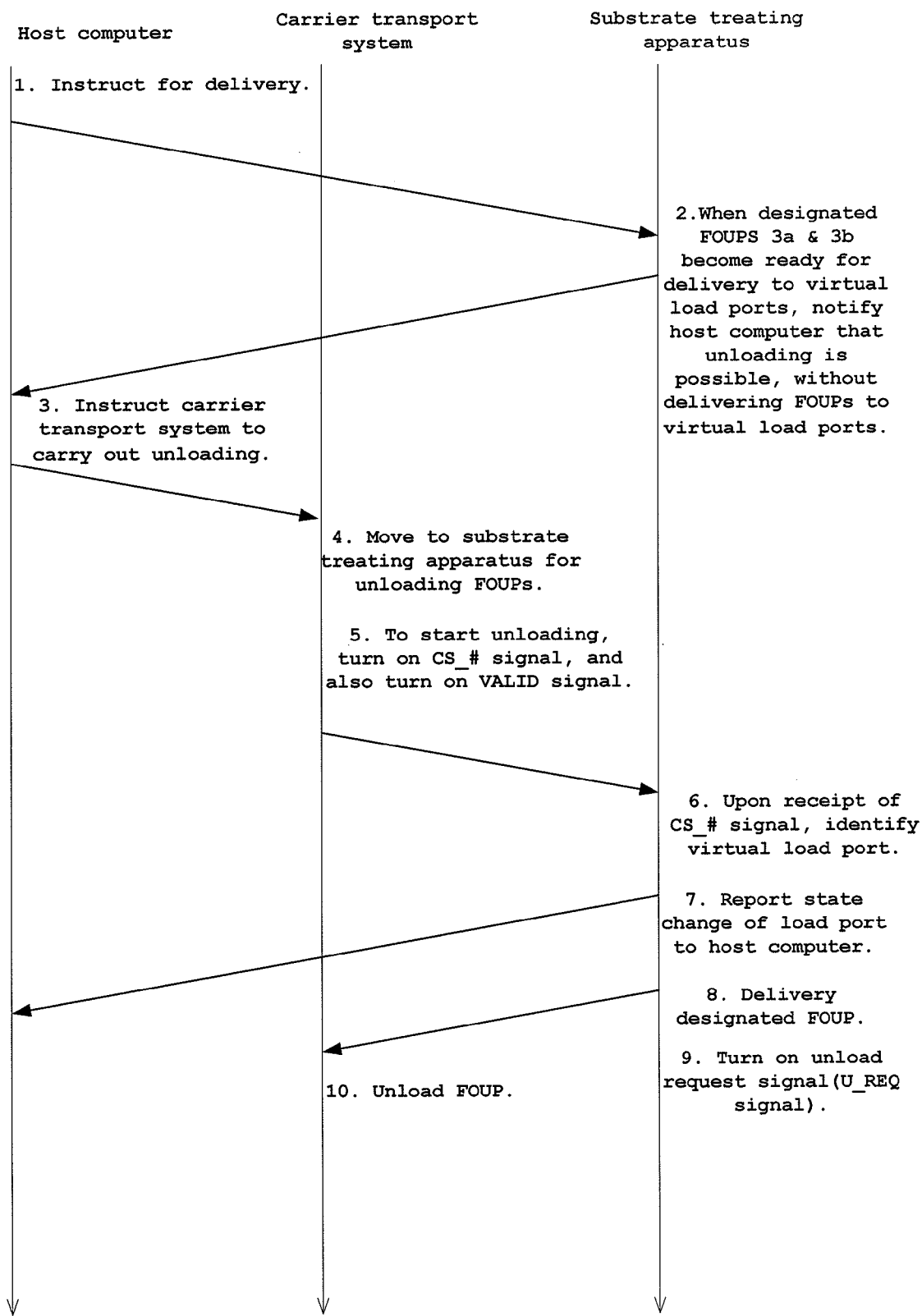
FIG. 14 is a time chart showing a sequence of an unloading process.
Figure 15:
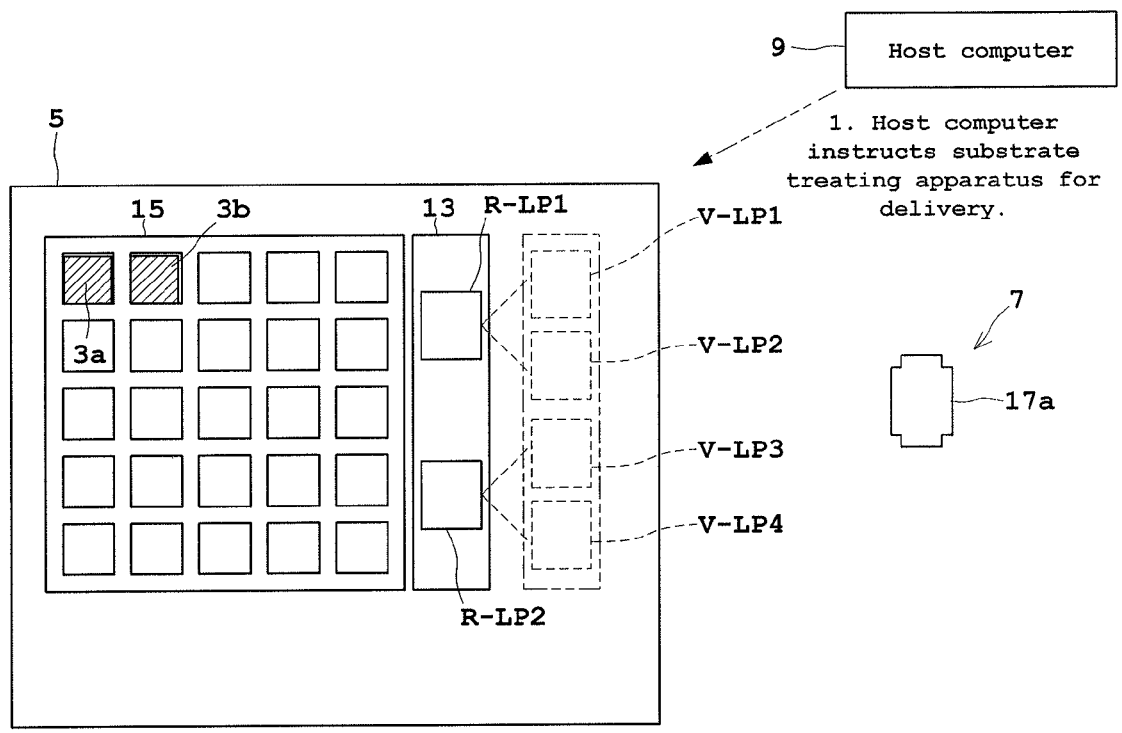
FIG. 15 is a schematic view showing the unloading process and unload instructions from the host computer.
Figure 16:
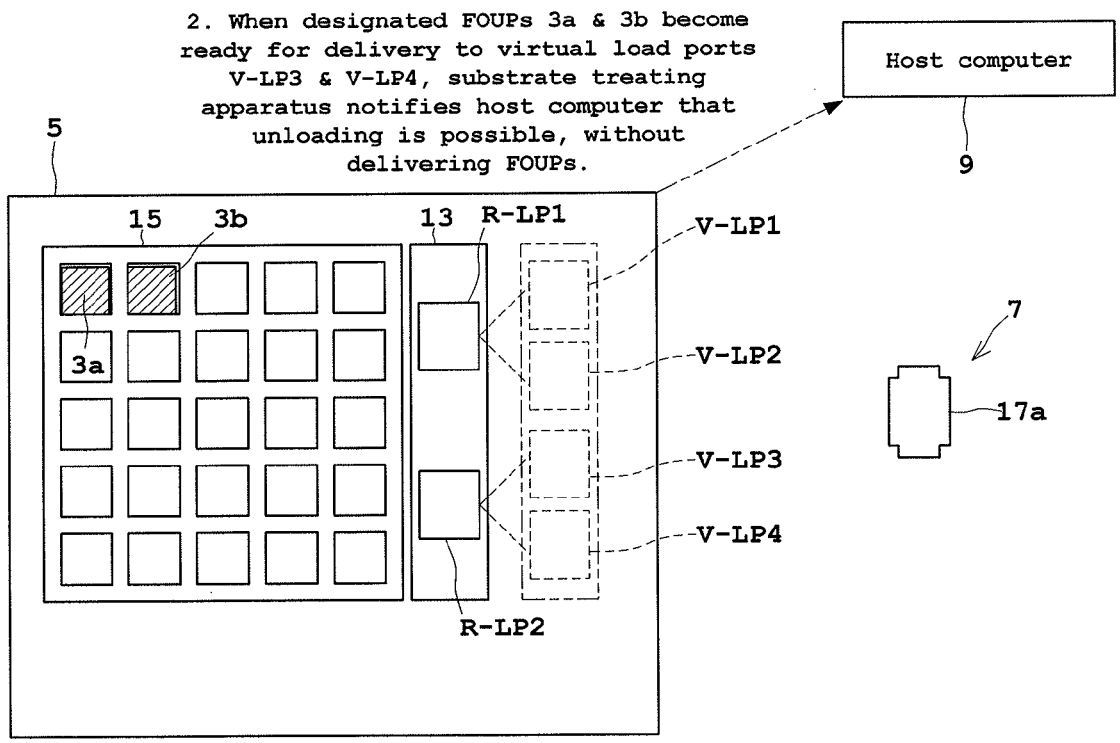
FIG. 16 is a schematic view showing the unloading process and an unload ready notice to the host computer.
Figure 17:
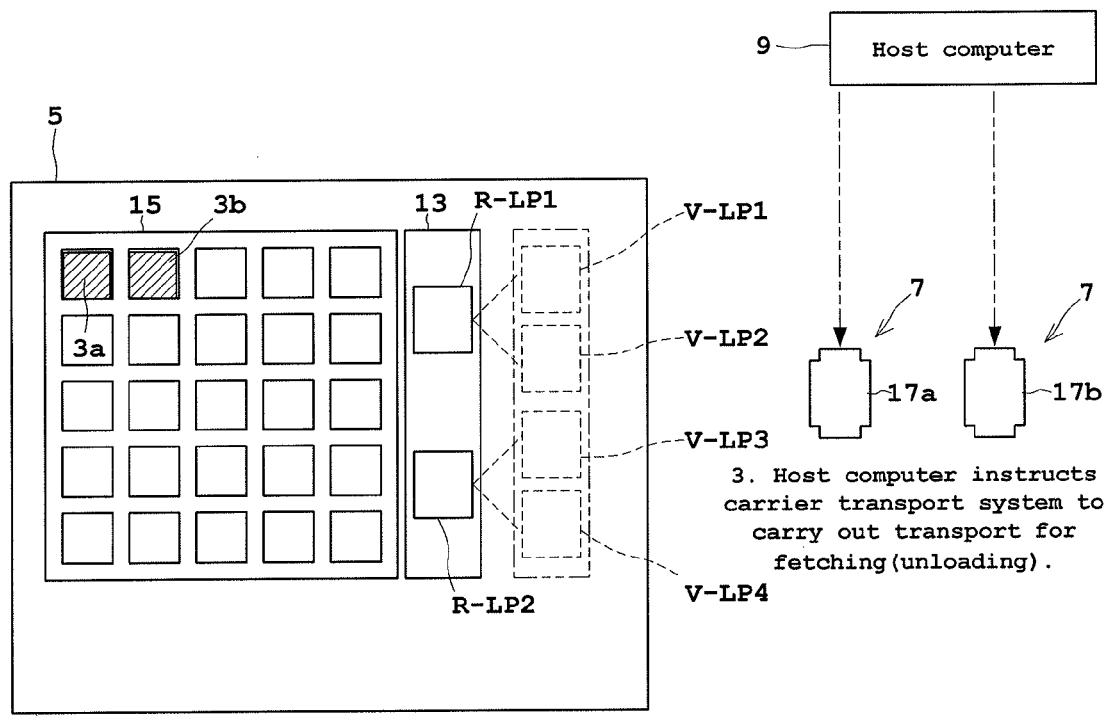
FIG. 17 is a schematic view showing the unloading process and unload instructions from the host computer.
Figure 18:
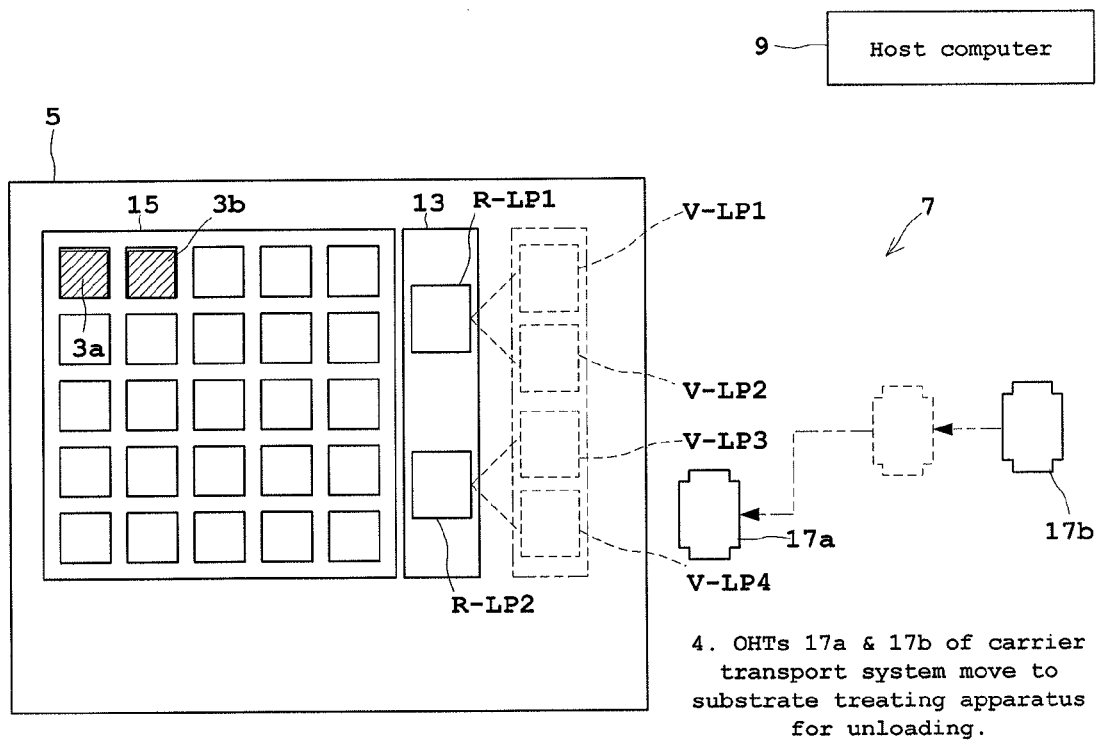
FIG. 18 is a schematic view showing the unloading process and a movement of the carrier transport system.
Figure 19:
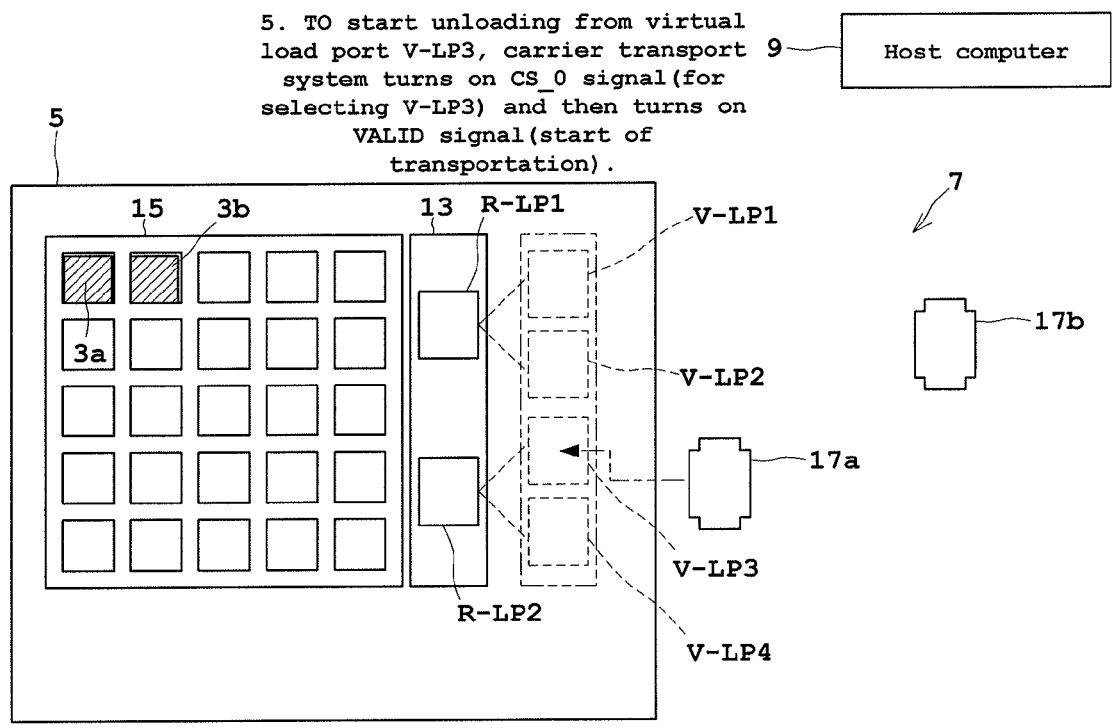
FIG. 19 is a schematic view showing the unloading process and a start of unloading by the carrier transport system.
Figure 20:
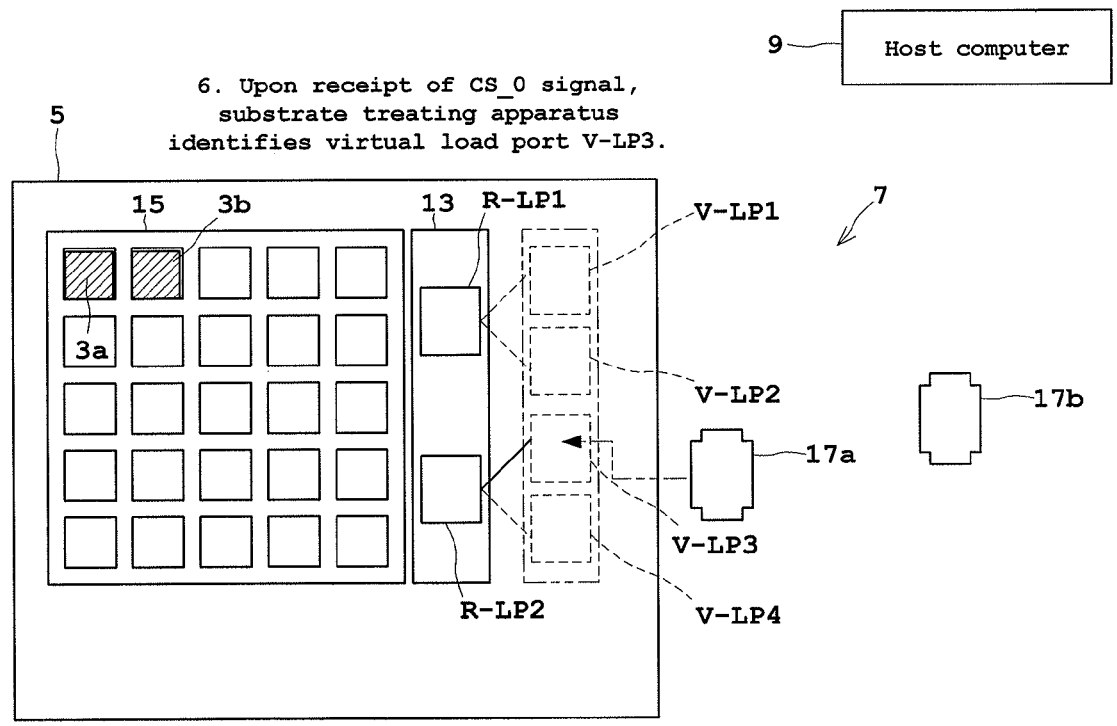
FIG. 20 is a schematic view showing the unloading process and matching of the load ports.
Figure 21:
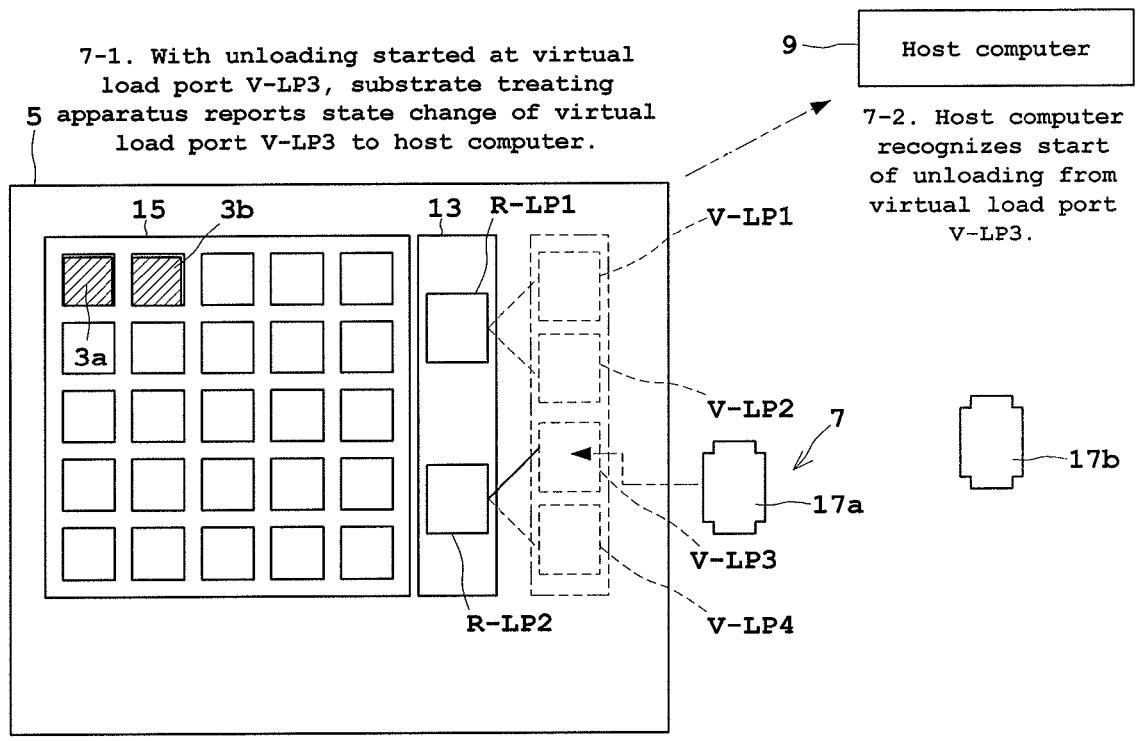
FIG. 21 is a schematic view showing the unloading process and a report on a state change of a virtual load port.
Figure 22:
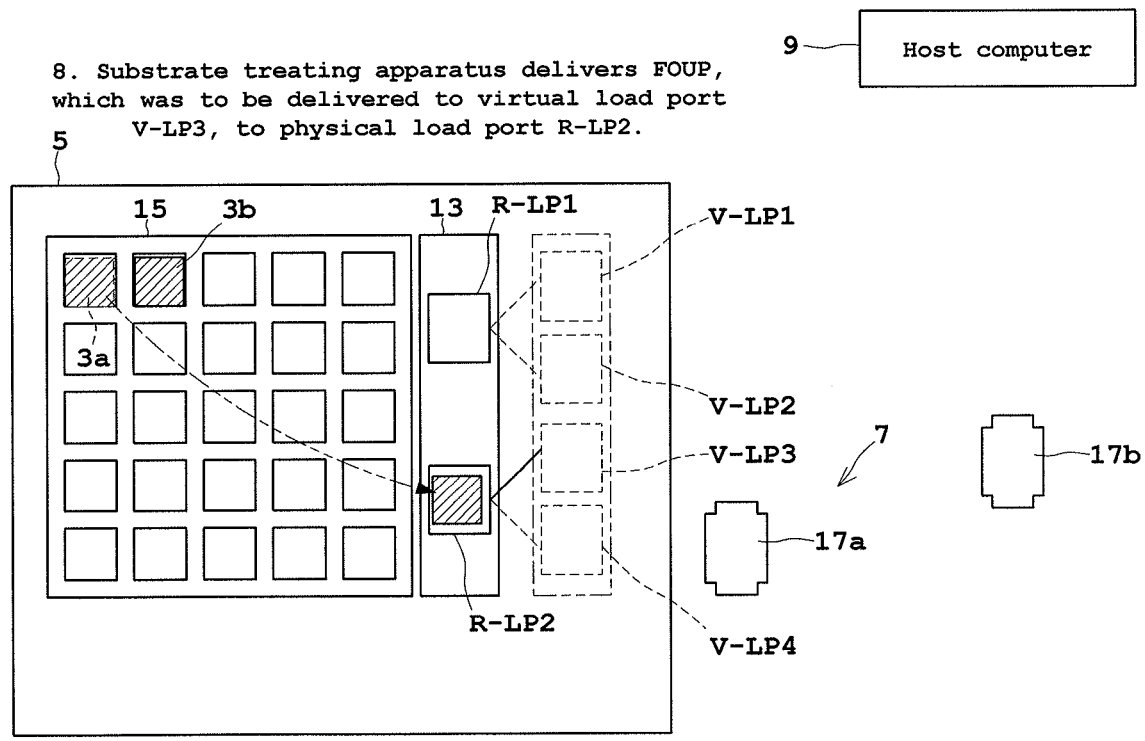
FIG. 22 is a schematic view showing the unloading process and showing a delivery.
Figure 23:
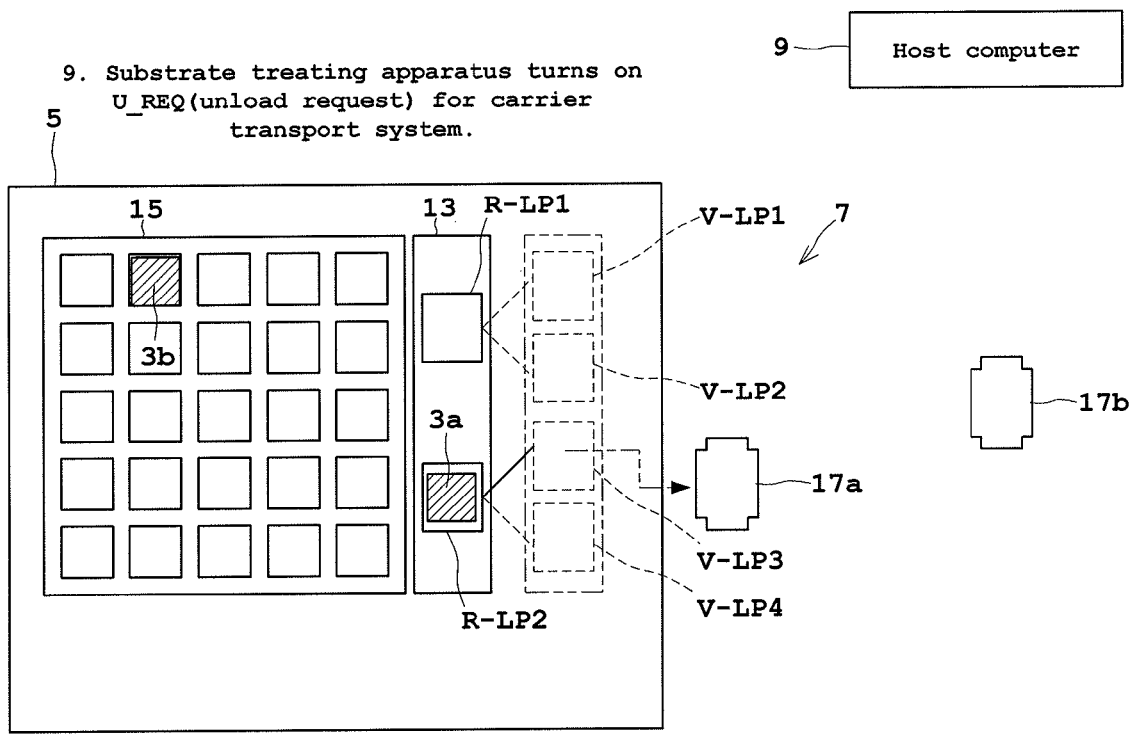
FIG. 23 is a schematic view showing the unloading process and a transport request to the carrier transport system.
Figure 24:
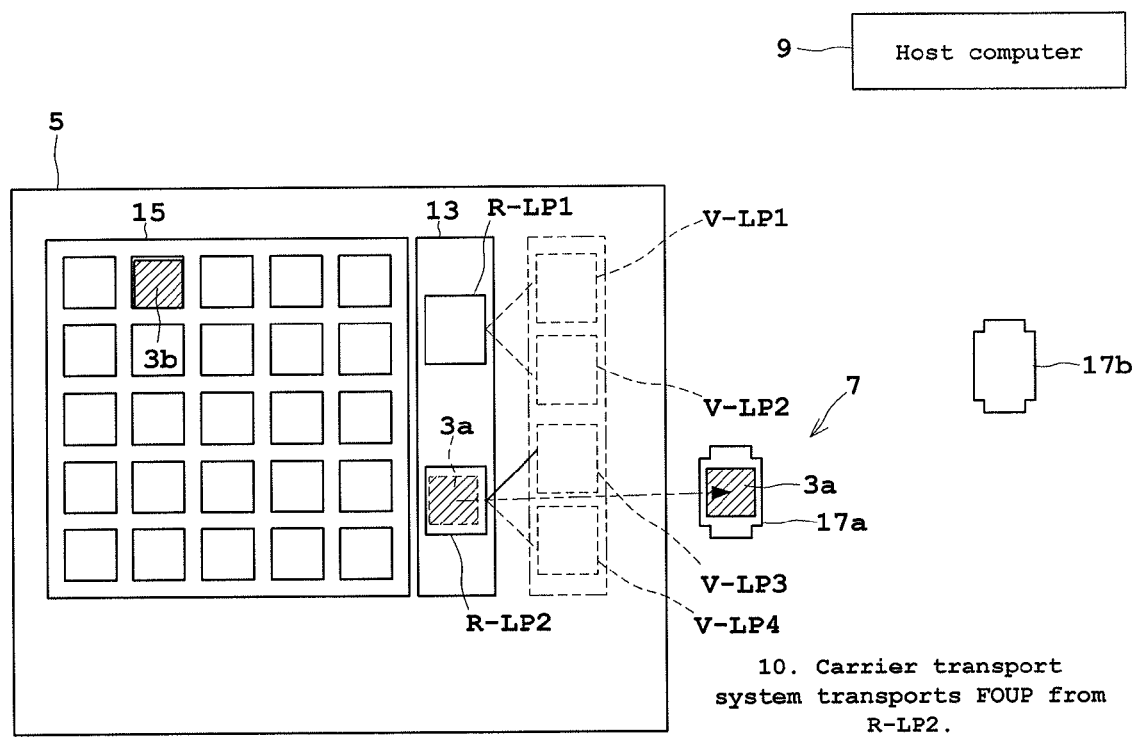
FIG. 24 is a schematic view showing the unloading process and unloading of a FOUP by the carrier transport system.
Figure 25:
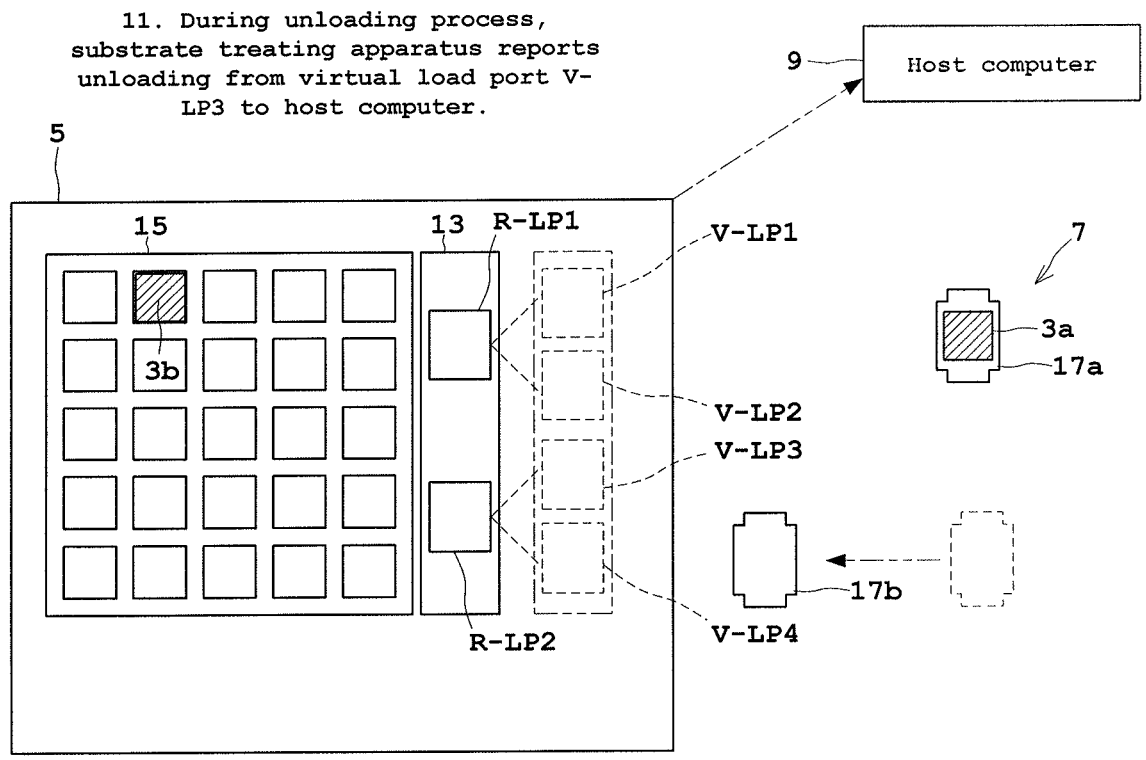
FIG. 25 is a schematic view showing the unloading process and a report on an unloading situation.
Figure 27:
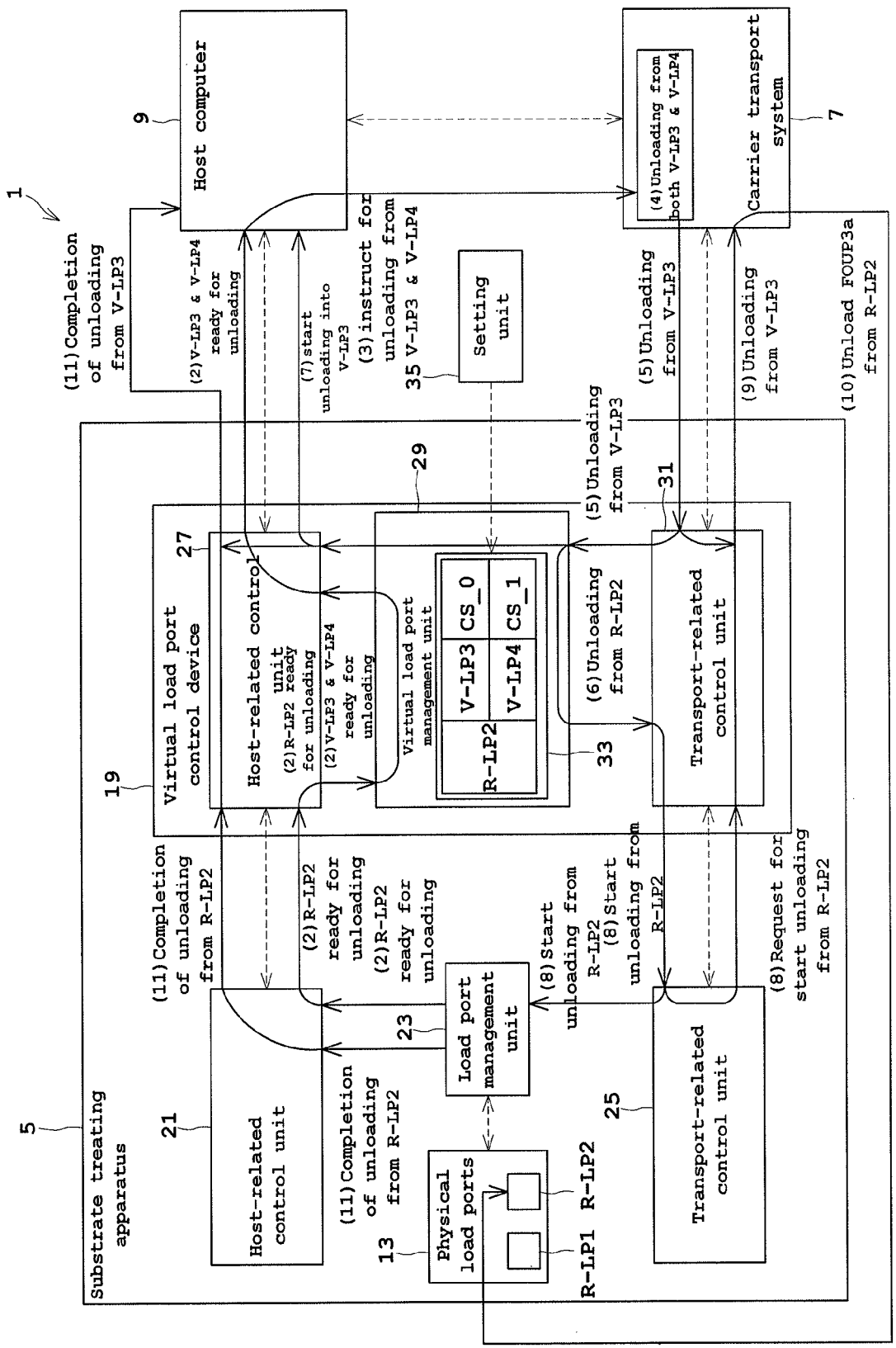
FIG. 27 is a schematic view showing an exchange of signals among the components during the unloading process.

FIG. 14 is a time chart showing a sequence of an unloading process. FIGS. 15-25 are schematic views showing the unloading process. FIG. 15 shows unload instructions from the host computer. FIG. 16 shows an unload ready notice to the host computer. FIG. 17 shows unload instructions from the host computer. FIG. 18 shows a movement of the carrier transport system. FIG. 19 shows a start of unloading by the carrier transport system. FIG. 20 shows matching of the load ports. FIG. 21 shows a report on a state change of a virtual load port. FIG. 22 shows a delivery. FIG. 23 shows a transport request to the carrier transport system. FIG. 24 shows unloading of a FOUP by the carrier transport system. FIG. 25 shows a report on an unloading situation. FIG. 27 is a schematic view showing an exchange of signals among the components during the unloading process.

In the following description, it is assumed that, as shown in FIG. 15, the physical load port R-LP1 is matched with the two virtual load ports V-LP1 and V-LP2, and the physical load port R-LP2 with the two virtual load ports V-LP3 and V-LP4. It is also assumed here that the two virtual load ports V-LP3 and V-LP4 are set for unloading purposes. To facilitate understanding, description will be made hereinafter only of the virtual load ports V-LP3 and V-LP4.

1. The host computer 9 instructs the substrate treating apparatus 5 to deliver FOUPs 3 storing treated wafers W (FIG. 15). It is assumed here, for example, that instructions require processed FOUPs 3 stored in the internal buffer 15 of the substrate treating apparatus 5 to be delivered successively to a substrate treating apparatus at a downstream stage or to the depository of FOUPs 3 not shown. These instructions are given to the load port management unit 23 via the host-related control unit 27 and host-related control unit 21 (not shown in FIG. 27).

2. When the designated FOUPs 3 become ready for delivery to the physical load port R-LP2, the substrate treating apparatus 5 notifies the host computer 9 that the FOUPs 3 are ready for unloading, without actually delivering the FOUPs 3 (FIG. 16).

To describe this in greater detail, the load port management unit 23, which manages the physical load port R-LP2 for unloading, first confirms states of the physical load port R-LP2 and internal buffer 15. And in response to the instructions from the host computer 9, the load port management unit 23 recognizes that the processed FOUPs 3a and 3b stored in the internal buffer 15 are "ready for unloading" from the physical load port R-LP2. Based on this, the host-related control unit 21 refers to the recognition by the load port management unit 23, and outputs a notice of the FOUPs 3a and 3b being "ready for unloading" from the physical load port R-LP2. With the conventional common construction, this output of "ready for unloading" notice would be transmitted directly to the host computer 9. However, in this invention, the "ready for unloading" notice outputted from the host-related control unit 21 is transmitted to the host-related control unit 27 of the virtual load port control unit 19. The host-related control unit 27 notifies the virtual load port management unit 29 of the receipt of this notice. Upon receipt of this notice, the virtual load port management unit 29 refers to the conversion table stored in the internal conversion table storage unit 33, and recognizes that the physical load port R-LP2 notified as "ready for unloading" is matched with the virtual load ports V-LP3 and V-LP4. Then, the virtual load port management unit 29 notifies the host-related control unit 27 that, instead of the physical load port R-LP2 notified as "ready for unloading", both virtual load ports V-LP3 and V-LP4 are to be treated as "ready for unloading". Based on such notice, the host-related control unit 27 notifies the host computer 9 that both virtual load ports V-LP3 and V-LP4 are "ready for unloading" of the FOUPs 3a and 3b.

3. The host computer 9 instructs the carrier transport system 7 to carry out transportation for fetching the designated FOUPs 3a and 3b (FIG. 17).

4. In order to unload the designated FOUPs 3a and 3b, the carrier transport system 7 moves two OHTs 17a and 17b to the substrate treating apparatus 5 having the FOUPs 3a and 3b (FIG. 18). The OHT 17a takes charge of transportation of the FOUP 3a from the virtual load port V-LP3, and the OHT 17b transportation of the FOUP 3b from the virtual load port V-LP4. The carrier transport system 7 has an actual position of the physical load port R-LP2 set thereto as position information on the virtual load ports V-LP1 and V-LP2 which are the destinations at this time. Thus, the movement of the OHTs 17a and 17b of the carrier transport system 7 will be performed in reality as movement to the physical load port R-LP2.

5. When the OHT 17a which is due to unload the FOUP 3a arrives at the virtual load port V-LP3 (physical load port R-LP2) of the substrate treating apparatus 5, the carrier transport system 7, in order to start unloading from the virtual load port V-LP3, turns on the CS_0 signal indicating the virtual load port V-LP3, and turns on the VALID signal (transport start) (FIG. 19). These signals are received by the virtual load port management unit 29 through the transport-related control unit 31.

6. The substrate treating apparatus 5 identifies the virtual load port V-LP3 in response to the CS_0 signal (FIG. 20). Specifically, the virtual load port management unit 29 identifies the virtual load port V-LP3.

7-1. With the start of unloading from the virtual load port V-LP3, the substrate treating apparatus 5 reports a change of state of the virtual load port V-LP3 to the host computer 9 (FIG. 21). Specifically, the virtual load port management unit 29 reports this to the host computer 9 through the host-related control unit 27.

7-2. The host computer 9 having received the report recognizes that unloading has started at the virtual load port V-LP3 (FIG. 21).

8. The substrate treating apparatus 5 delivers the designated FOUP 3a to the virtual load port V-LP3 (FIG. 22). In practice, since the virtual load port V-LP3 is matched with the physical load port R-LP2, the FOUP 3a is delivered to the physical load port R-LP2. To describe this specifically, the virtual load port management unit 29, which identified the virtual load port V-LP3 in step 6 above, recognizes from the conversion table stored in the conversion table storage unit 33 that the virtual load port V-LP3 identified corresponds to the physical load port R-LP2, and instructs the transport-related control unit 31 to perform unloading from the physical load port R-LP2. Upon such instructions, the transport-related control unit 31 communicates the instructions to the transport-related control unit 25 that unloading should be made from the physical load port R-LP2. The transport-related control unit 25 having received this communication instructs the load port management unit 23 to carry out an operation to unload the FOUP 3a from the physical load port R-LP2, and transmits an "unload start" request to the transport-related control unit 31. Such a request signal would be transmitted to the carrier transport system 7 if this were a conventional substrate treating system. In this invention, this request signal is transmitted to the transport-related control unit 31 of the virtual load port control device 19. Based on such instructions, the load port management unit 23 carries out an operation for delivering the FOUP 3a stored in the internal buffer 15 to the physical load port R-LP2.

9. The substrate treating apparatus 5 turns on a signal indicating a transport request for the carrier transport system 7 (FIG. 23). Specifically, the transport-related control unit 31 can recognize that the request signal received from the transport-related control unit 25 and indicating "unload start" for the above physical load port R-LP2 is a response to the notice of unloading of the FOUP 3a from the virtual load port V-LP3 received from the carrier transport system 7 in step 5 above. Based on such recognition, the transport-related control unit 31 transmits such request signal of "unload start" to the carrier transport system 7 as "unload start" request relating to the virtual load port V-LP3. As such request signal, the transport-related control unit 31 turns on U_REQ signal for the carrier transport system 7. U_REQ stands for unload request.

10. The carrier transport system 7 unloads the FOUP 3a from the virtual load port V-LP3 (FIG. 24). In practice, since the virtual load port V-LP3 corresponds to the physical load port R-LP2, the FOUP 3a is unloaded from the physical load port R-LP2.

11. The substrate treating apparatus 5 reports to the host computer 9 that the unloading has been carried out at the virtual load port V-LP3 in the above unloading process (FIG. 25). Specifically, the load port management unit 23 recognizes the situation of the physical load port R-LP2, and transmits a report to the host computer 9 through the host-related control unit 21 and host-related control unit 27.

At this time, the host-related control unit 21 transmits to the host-related control unit 27 the "unloading completion" report on the physical load port R-LP2 received from the load port management unit 23. The host-related control unit 27 can recognize that the "unloading completion" report from the host-related control unit 21 is a response to the notice of the start of unloading the FOUP 3a from the virtual load port V-LP3, which notice was received from the virtual load port management unit 29 in step 7 above. Based on such recognition, the host-related control unit 27 transmits the "unloading completion" report to the host computer 9 as an "unloading completion" report on the virtual load port V-LP3.

When a new next FOUP 3c (Not shown) storing treated wafers W is subsequently transported to the internal buffer 15, the physical load port R-LP2 will become ready for unloading again. That is, the virtual load port V-LP3 corresponding to the physical load port R-LP2 becomes ready for unloading again. Thus, as in step 2 above, the load port management unit 23 recognizes the state of the physical load port R-LP2 as "ready for unloading". Consequently, the host-related control unit 21 refers to the recognition by the load port management unit 23, and transmits a "ready" notice to the host-related control unit 27 of the virtual load port control device 19. In response thereto, the host-related control unit 27 recognizes that the virtual load port V-LP3 has become "ready", as in the case of the above "unloading completion" report, and notifies this to the host computer 9. Such "ready" notice will be made immediately or with a slight delay after the above "unloading completion" report, depending on the timing of transportation of the FOUP 3c to the internal buffer 15. In the described case, the "ready" state of the virtual load port V-LP4 has already been reported in step 2 above, and accordingly, the OHT 17b has already started moving to the substrate treating apparatus 5. Here, therefore, no new notice is made with regard to the virtual load port V-LP4.

12. When the OHT 17b arrives at the substrate treating apparatus 5 slightly later than the OHT 17a, the carrier transport system 7, as in step 4 above, notifies the substrate treating apparatus 5 that the FOUP 3b will be unloaded from the virtual load port V-LP4. Specifically, the carrier transport system 7 turns on CS_1 (indicating the virtual load port V-LP4), further turns on the VALID signal indicating a transport start, and transmits the signals to the transport-related control unit 31. Subsequently, as described hereinbefore, an unloading from the physical load port R-LP2 is carried out as unloading from the virtual load port V-LP4.

The virtual load port V-LP4 is the other virtual load port matched with the same physical load port R-LP2. Even when only the processed FOUP 3a is stored in the internal buffer 15 in step 1 of the above unloading process, the virtual load port control device 19 notifies the host computer 9 that the other virtual load port V-LP4 allotted to the physical load port R-LP2 corresponding to the one virtual load port V-LP3 is available for unloading at any time.

Therefore, the host computer 9 can instruct the carrier transport system 7 to unload from the same physical load port R-LP2 in the above period by turning on the CS_1 signal indicating the virtual load port V-LP4. Thus, an efficient unloading can be carried out.

According to this embodiment, two virtual load ports V-LP3 and V-LP4 are allotted to one physical load port V-LP2, with both of the virtual load ports V-LP3 and V-LP4 being "ready for unloading", and two OHTs 17 can be moved at the same time to transport FOUPs 3 from the respective load ports V-LP3 and V-LP4. Compared with the case of only one OHT 17 engaging in the transporting operation for one physical load port R-LP2, this embodiment can increase the number of FOUPs transportable per unit time. In other words, the time taken for transporting each FOUP can be shortened.

As seen from FIG. 27, the virtual load port control device 19 handles only signals relating to the physical load port R-LP2 in the communication with the host-related control unit 21 and transport-related control unit 25 which are inherent in the substrate treating apparatus 5, and handles only signals relating to the virtual load ports V-LP3 and V-LP4 in the communication with the host computer 9 and carrier transport system 7. That is, the virtual load port control device 19 is interposed between the substrate treating apparatus 5, and the host computer 9/carrier transport system 7 to carry out matching of the physical load port R-LP2 and the virtual load ports V-LP3 and V-LP4, and conversion of the signals. The controls according to this invention can be implemented easily, without changing in any way the constructions of hardware and software of the conventional substrate treating apparatus 5, host computer 9 and carrier transport system 7, and only by interposing the virtual load port control device 19 in between. The construction of the conventional substrate treating system can easily be reinstated only by removing the virtual load port control device 19.

According to this embodiment, as described above, the virtual load port control device 19 allots two virtual load ports V-LP1 and V-LP2 or V-LP3 and V-LP4 to each of the physical load ports R-LP1 and R-LP2. Further, the virtual load port control device 19 causes the carrier transport system 7 and host computer 9 to treat the four virtual load ports V-LP1, V-LP2, V-LP3 and V-LP4 as four physical load ports. Therefore, the FOUPs 3 can be transported as if there were more load ports than the actual number of physical load ports, and can in appearance increase the number of load ports. As a result, the efficiency of transporting FOUPs 3 can be improved while holding down apparatus cost.

This invention is not limited to the foregoing embodiment, but may be modified as follows:

(1) The foregoing embodiment allots two virtual load ports V-LP1 and V-LP2 to one physical load port R-LP1. This invention is not limited to this. For example, three or more virtual load ports may be allotted to one physics load port R-LP1.

(2) The foregoing embodiment allots two virtual load ports V-LP1 and V-LP2 to one physical load port R-LP1, allots virtual load ports V-LP3 and V-LP4 to the other physical load port R-LP2, and allots them to either loading or unloading. Apart from such allotment, this invention may allot one of the two virtual load ports allotted to one physical load port to loading, and the other to unloading. A virtual load port may be allotted to only one of the loading and unloading.

(3) In the foregoing embodiment, the conversion table stored in the conversion table storage unit 33 is set as fixed through the setting unit 35. The conversion table may be rewritten as appropriate according to situations, to change use/non-use of the virtual load ports and allotment of the virtual load ports dynamically. This enables flexible operation according to situations of the substrate treating system 1. When it is desired to perform loading quickly, an increased number of virtual load ports may be allotted to the loading.

(4) In the foregoing embodiment, the carrier transport system 7 is illustrated as having OHTs 17. These may be replaced with AGVs (Automatic Guided Vehicles).

(5) In the foregoing embodiment, the virtual load port control device 19 is post-installed between a common substrate treating apparatus and the host computer 9/carrier transport system 7. The efficiency of transporting the FOUPs is improved by adding the virtual load port control device 19 of this invention to a common substrate treating apparatus or an existing substrate treating apparatus already installed in a factory or the like. Instead, for example, the substrate treating apparatus 5 may include, installed therein from the beginning, a control device having the functions of both the load port control device 20 and virtual load port control device 19. The virtual load port control device 19 may be installed between the host computer 9 and carrier transport system 7, independently of the substrate treating apparatus 5. Further, the functions of the virtual load port control device 19 may be incorporated into the host computer 9 as an integral part of the latter.

(6) In the foregoing embodiment, two OHTs 17 perform transportation at the same time to and from two virtual load ports, for both loading and unloading of FOUPs 3 to/from the substrate treating apparatus 5. This is effective, for example, when there is sufficient available space in the internal buffer 15 at the time of loading, and when enough FOUPs to be unloaded are stored in the internal buffer 15 at the time of unloading. When there were available space only for one FOUP in the internal buffer 15 at the time of loading, and two OHTs 17 performed transportation to two virtual load ports at the same time, there would be no space in the internal buffer 15 for storing the FOUPs transported and loaded to the substrate treating apparatus 5, and the OHTs 17 could be kept waiting in front of the substrate treating apparatus 5 for a long time. When only one FOUP were stored in the internal buffer 15 at the time of unloading, and two OHTs 17 performed transportation from two virtual load ports at the same time, the second OHT 17 having arrived at the substrate treating apparatus 5 would have no FOUP to unload, and this OHT 17 could be kept waiting in front of the substrate treating apparatus 5 for a long time. It is therefore preferable that the virtual load port control device 19 gives an "available for loading" or "ready for unloading" notice to the host computer 9, by taking the state of the internal buffer 15 into consideration, and only after determining or confirming that there is sufficient available space in the internal buffer 15, or that enough FOUPs to be unloaded are stored in the internal buffer 15. Such determination or confirmation can be made by arranging that the virtual load port control device 19 receives the state of the internal buffer 15 recognized by the load port management unit 23, directly or via the host-related control unit 21 from the load port management unit 23.

This invention may be embodied in other specific forms without departing from the spirit or essential attributes thereof and, accordingly, reference should be made to the appended claims, rather than to the foregoing specification, as indicating the scope of the invention.

What is claimed is:

1. A control apparatus for a substrate treating system, the substrate treating system comprising:

a substrate treating apparatus having one physical load port for receiving pods for storing substrates, and a carrier transport system for transporting the pods to and from the one physical load port, the control apparatus comprising:
a virtual load port control device for allotting a plurality of virtual load ports to the one physical load port, and instructing the carrier transport system to perform a transporting operation to and from the plurality of virtual load ports on an assumption that the plurality of virtual load ports really exist.

2. A substrate treating method for a substrate treating system, the substrate treating system comprising:
a substrate treating apparatus having one physical load port for receiving pods for storing substrates, and a carrier transport system for transporting the pods to and from the one physical load port, the substrate treating method comprising:
allotting a plurality of virtual load ports to the one physical load port, and instructing the carrier transport system to perform a transporting operation to and from the plurality of virtual load ports on an assumption that the plurality of virtual load ports really exist.

3. A substrate treating system, the substrate treating system comprising:
a substrate treating apparatus having one physical load port for receiving pods for storing substrates, and a carrier transport system for transporting the pods to and from the one physical load port, the substrate treating system comprising:
a virtual load port control device for allotting a plurality of virtual load ports to the one physical load port, and instructing the carrier transport system to perform a transporting operation to and from the plurality of virtual load ports on an assumption that the plurality of virtual load ports really exist.

4. A method of operating a substrate treating system with a substrate treating apparatus having one physical load port for receiving pods for storing substrates and a physical load port control device for controlling operation of the one physical load port, and a carrier transport system for transporting the pods to and from the physical load port, the method of operating the substrate treating system comprising:
interposing a virtual load port control device between the physical load port control device and the carrier transport system for allotting a plurality of virtual load ports to the one physical load port, and instructing the carrier transport system to perform a transporting operation to and from the plurality of virtual load ports on an assumption that the plurality of virtual load ports really exist.

5. A method of operating a substrate treating system with a substrate treating apparatus having a physical load port for receiving pods for storing substrates and a physical load port control device for controlling operation of the physical load port, and a carrier transport system for transporting the pods to and from the physical load port, the method of operating the substrate treating system comprising:
interposing a virtual load port control device between the physical load port control device and the carrier transport system for allotting a virtual load port to the physical load port, and instructing the carrier transport system to perform a transporting operation to and from the virtual load port on an assumption that the virtual load port really exists;
wherein the virtual load port control device executes a step of converting a first signal transmitted from the physical load port control device to the carrier transport system, into a second signal from the virtual load port, and transmitting the second signal to the carrier transport system, and converting a third signal transmitted from the carrier transport system to the virtual load port, into a fourth signal to the physical load port, and transmitting the fourth signal to the physical load port control device.

6. The control apparatus in the substrate treating system according to claim 1, wherein the virtual load port control device is arranged to instruct the carrier transport system to perform a transporting operation to the virtual load port, which instructions require a transport operation to be made to a location of the physical load port to which the virtual load port is allotted.

7. A load port control apparatus in a substrate treating system, the substrate treating system comprising:
a substrate treating apparatus having a substrate treating unit for carrying out predetermined treatments of substrates, one physical load port for receiving pods for storing the substrates, the load port transferring the pods to and from the substrate treating unit, and an internal buffer interposed between the substrate treating unit and the load port for transferring the substrates to and from the substrate treating unit, transferring the pods to and from the load port, and storing the pods transferred, a carrier transport system for transferring the pods to and from the load port, and a host computer for communicating with the substrate treating apparatus and the carrier transport system, and instructing the carrier transport system to transport the pods according to a situation of the substrate treating apparatus, the load port control apparatus comprising:
a virtual load port management unit for allotting a plurality of virtual load ports to the one physical load port, and causing the carrier transport system and the host computer to treat the plurality of virtual load ports as a plurality of physical load ports.

8. The load port control apparatus according to claim 7, wherein the virtual load port management unit sets the virtual load ports only for loading.

9. The load port control apparatus according to claim 7, wherein the virtual load port management unit sets the virtual load ports only for unloading.

10. The load port control apparatus according to claim 7, wherein the virtual load port management unit sets the virtual load ports for loading or unloading.

11. The load port control apparatus according to claim 7, wherein the virtual load port management unit has a conversion table specifying a correspondence relationship between the plurality of virtual load ports and the physical load port, and when the plurality of virtual load ports are set for loading purposes,
(A1) the virtual load port management unit reports to the host computer whether each of the virtual load ports is available for loading;
(A2) the host computer instructs the carrier transport system to load a pod into one of the virtual load ports;
(A3) the carrier transport system holding the pod moves to the substrate treating apparatus in order to transport the pod to the designated one of the virtual load ports;
(A4) the carrier transport system, in order to start loading the pod into the one virtual load port, notifies the virtual load port management unit of loading of the pod into the one virtual load port;
(A5) the virtual load port management unit matches the one virtual load port with the physical load port based on the conversion table;
(A6) the virtual load port management unit notifies the host computer that loading of the pod to the one virtual load port has been started;

(A7) the virtual load port management unit accepts the loading into the virtual load port, and sends a load request to the carrier transport system;

(A8) the carrier transport system transports the pod to the physical load port allotted to the one virtual load port;

(A9) the substrate treating apparatus transports the pod loaded into the one virtual load port to the internal buffer; and (A10) when notifying the host computer of a situation of loading into the one virtual load port in the loading step, the virtual load port management unit notifies the host computer that a different virtual load port allotted to the physical load port corresponding to the one virtual load port is available for loading, from a point of time when the carrier transport system starts moving to the substrate treating apparatus in order to transport the one designated pod, until before the one designated pod is placed on the physical load port corresponding to the one virtual load port, and notifies the host computer that the different virtual load port allotted to the physical load port corresponding to the one virtual load port is available for loading, at a point of time when the pod begins to be transported to the internal buffer from the physical load port corresponding to the one virtual load port.

12. The load port control apparatus according to claim 11, wherein the virtual load port management unit sets the virtual load ports only for loading.

13. The load port control apparatus according to claim 7, wherein the virtual load port management unit has a conversion table specifying a correspondence relationship between the plurality of virtual load ports and the physical load port, and when the plurality of virtual load ports are set for unloading purposes, (B1) the host computer instructs the substrate treating apparatus to deliver a designated pod to one of the virtual load ports;

(B2) the substrate treating apparatus, when the designated pod can be delivered to the one virtual load port, notifies the host computer that the pod is ready for unloading;

(B3) the host computer instructs the carrier transport system to transport the designated pod;

(B4) the carrier transport system moves to the substrate treating apparatus having the designated pod;

(B5) the carrier transport system, in order to unload the designated pod from the one virtual load port, instructs the virtual load port management unit to deliver the pod to the one virtual load port;

(B6) the virtual load port management unit matches the one virtual load port with the physical load port based on the conversion table;

(B8) the substrate treating apparatus delivers the designated pod to the physical load port allotted to the one virtual load port;

(B9) the substrate treating apparatus sends an unload request to the carrier transport system;

(B10) the carrier transport system unloads the pod from the one virtual load port; and (B11) when notifying the host computer of a situation of unloading from the one virtual load port in the unloading step, the virtual load port management unit is capable of notifying the host computer that a different virtual load port allotted to the physical load port corresponding to the one virtual load port is available for unloading.

14. The load port control apparatus according to claim 13, wherein the virtual load port management unit sets the virtual load ports only for unloading.

15. A substrate treating system comprising:

a substrate treating apparatus having a substrate treating unit for carrying out predetermined treatments of substrates, one physical load port for receiving pods for storing the substrates, the load port transferring the pods to and from the substrate treating unit, and an internal buffer interposed between the substrate treating unit and the load port for transferring the substrates to and from the substrate treating unit, transferring the pods to and from the load port, and storing the pods transferred;

a carrier transport system for transferring the pods to and from the load port;

a host computer for communicating with the substrate treating apparatus and the carrier transport system, and instructing the carrier transport system to transport the pods according to a situation of the substrate treating apparatus; and a load port control device having a virtual load port management unit for allotting a plurality of virtual load ports to the one physical load port, and causing the carrier transport system and the host computer to treat the plurality of virtual load ports as a plurality of physical load ports.

16. The substrate treating system according to claim 15, wherein the virtual load port management unit has a conversion table specifying a correspondence relationship between the plurality of virtual load ports and the physical load port, and when the plurality of virtual load ports are set for loading purposes, (A1) the virtual load port management unit reports to the host computer whether each of the virtual load ports is available for loading;

(A2) the host computer instructs the carrier transport system to load a pod into one of the virtual load ports;

(A3) the carrier transport system holding the pod moves to the substrate treating apparatus in order to transport the pod to the designated one of the virtual load ports;

(A4) the carrier transport system, in order to start loading the pod into the one virtual load port, notifies the virtual load port management unit of loading of the pod into the one virtual load port;

(A5) the virtual load port management unit matches the one virtual load port with the physical load port based on the conversion table;

(A6) the virtual load port management unit notifies the host computer that loading of the pod to the one virtual load port has been started;

(A7) the virtual load port management unit accepts the loading into the virtual load port, and sends a load request to the carrier transport system;

(A8) the carrier transport system transports the pod to the physical load port allotted to the one virtual load port;

(A9) the substrate treating apparatus transports the pod loaded into the one virtual load port to the internal buffer; and (A10) when notifying the host computer of a situation of loading into the one virtual load port in the loading step, the virtual load port management unit notifies the host computer that a different virtual load port allotted to the physical load port corresponding to the one virtual load port is available for loading, from a point of time when the carrier transport system starts moving to the substrate treating apparatus in order to transport the one designated pod, until before the one designated pod is placed on the physical load port corresponding to the one virtual load port, and notifies the host computer that the different virtual load port allotted to the physical load port corresponding to the one virtual load port is available for loading, at a point of time when the pod begins to be transported to the internal buffer from the physical load port corresponding to the one virtual load port.

17. The substrate treating system according to claim 15, wherein the virtual load port management unit has a conversion table specifying a correspondence relationship between the plurality of virtual load ports and the physical load port, and when the plurality of virtual load ports are set for unloading purposes, (B1) the host computer instructs the substrate treating apparatus to deliver a designated pod to one of the virtual load ports;

(B2) the substrate treating apparatus, when the designated pod can be delivered to the one virtual load port, notifies the host computer that the pod is ready for unloading;

(B3) the host computer instructs the carrier transport system to transport the designated pod;

(B4) the carrier transport system moves to the substrate treating apparatus having the designated pod;

(B5) the carrier transport system, in order to unload the designated pod from the one virtual load port, instructs the virtual load port management unit to deliver the pod to the one virtual load port;

(B6) the virtual load port management unit matches the one virtual load port with the physical load port based on the conversion table;

(B8) the substrate treating apparatus delivers the designated pod to the physical load port allotted to the one virtual load port;

(B9) the substrate treating apparatus sends an unload request to the carrier transport system;

(B10) the carrier transport system unloads the pod from the one virtual load port; and (B11) when notifying the host computer of a situation of unloading from the one virtual load port in the unloading step, the virtual load port management unit is capable of notigying the host computer that a different virtual load port allotted to the physical load port corresponding to the one virtual load port is available for unloading.

* * * * *